United States Patent
Fujita et al.

(10) Patent No.: US 8,957,934 B2
(45) Date of Patent: Feb. 17, 2015

(54) LIGHT SOURCE DRIVE CIRCUIT, OPTICAL SCANNING APPARATUS, SEMICONDUCTOR DRIVE CIRCUIT, AND IMAGE FORMING APPARATUS

(71) Applicants: Hayato Fujita, Kanagawa (JP); Atsufumi Omori, Kanagawa (JP); Muneaki Iwata, Kanagawa (JP); Masaaki Ishida, Kanagawa (JP)

(72) Inventors: Hayato Fujita, Kanagawa (JP); Atsufumi Omori, Kanagawa (JP); Muneaki Iwata, Kanagawa (JP); Masaaki Ishida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/072,946

(22) Filed: Nov. 6, 2013

(65) Prior Publication Data

US 2014/0139603 A1    May 22, 2014

(30) Foreign Application Priority Data

Nov. 21, 2012  (JP) ................. 2012-255470
Nov. 29, 2012  (JP) ................. 2012-260529

(51) Int. Cl.
```
B41J 2/435     (2006.01)
B41J 2/47      (2006.01)
H01S 5/06      (2006.01)
H05B 37/02     (2006.01)
H01S 5/042     (2006.01)
G06K 15/12     (2006.01)
H01S 5/068     (2006.01)
```

(52) U.S. Cl.
CPC ...... *H01S 5/06* (2013.01); *H05B 37/02* (2013.01); *B41J 2/435* (2013.01); *H01S 5/0427* (2013.01); *B41J 2/471* (2013.01); *G06K 15/1209* (2013.01); *Y02B 20/202* (2013.01); *H01S 5/068* (2013.01)
USPC ........................................... 347/237; 347/247

(58) Field of Classification Search
USPC ......... 347/128, 132, 135, 144, 236, 237, 246, 347/247; 250/205
See application file for complete search history.

(56) References Cited

U.S. PATENT DOCUMENTS

| | | | |
|---|---|---|---|
| 4,835,780 A * | 5/1989 | Sugimura et al. | 372/29.01 |
| 6,388,689 B1 * | 5/2002 | Toda et al. | 347/132 |
| 6,587,489 B2 * | 7/2003 | Schrodinger | 372/29.01 |
| 6,917,639 B2 | 7/2005 | Ishida et al. | |
| 7,660,064 B2 * | 2/2010 | Howley et al. | 360/68 |
| 7,701,480 B2 * | 4/2010 | Omori et al. | 347/237 |
| 7,936,367 B2 | 5/2011 | Ishida et al. | |
| 8,054,325 B2 * | 11/2011 | Kawamoto | 347/237 |
| 8,072,667 B2 | 12/2011 | Suzuki et al. | |

(Continued)

FOREIGN PATENT DOCUMENTS

| | | |
|---|---|---|
| JP | 04-283978 | 10/1992 |
| JP | 05-328071 | 12/1993 |

(Continued)

*Primary Examiner* — Hai C Pham
(74) *Attorney, Agent, or Firm* — Oblon, Spivak, McClelland, Maier & Neustadt, L.L.P.

(57) ABSTRACT

A light source drive circuit which drives a light source is disclosed, including a drive current generating unit which generates a drive current, the driving current including a predetermined current for obtaining a predetermined light amount from the light source; and first and second overshoot currents which are applied to the predetermined current in synchronization thereto; and a control unit which sets, to the drive current generating unit, a value of the first overshoot current to a fixed value, and a value of the second overshoot current in accordance with a light amount output from the light source.

9 Claims, 34 Drawing Sheets

(56) References Cited

U.S. PATENT DOCUMENTS

| | | |
|---|---|---|
| 8,207,996 B2 | 6/2012 | Miyake et al. |
| 8,237,760 B2 | 8/2012 | Nihei et al. |
| 8,310,513 B2 | 11/2012 | Nihei et al. |
| 2009/0195635 A1 | 8/2009 | Ishida et al. |
| 2010/0119262 A1 | 5/2010 | Omori et al. |
| 2011/0199657 A1 | 8/2011 | Ishida et al. |
| 2011/0228037 A1 | 9/2011 | Omori et al. |
| 2012/0099165 A1 | 4/2012 | Omori et al. |
| 2012/0189328 A1 | 7/2012 | Suzuki et al. |
| 2012/0293783 A1 | 11/2012 | Ishida et al. |

FOREIGN PATENT DOCUMENTS

| | | |
|---|---|---|
| JP | 09-083050 | 3/1997 |
| JP | 11-135860 | 5/1999 |
| JP | 3466599 | 8/2003 |
| JP | 4349470 | 7/2009 |
| JP | 2011-216843 | 10/2011 |

* cited by examiner

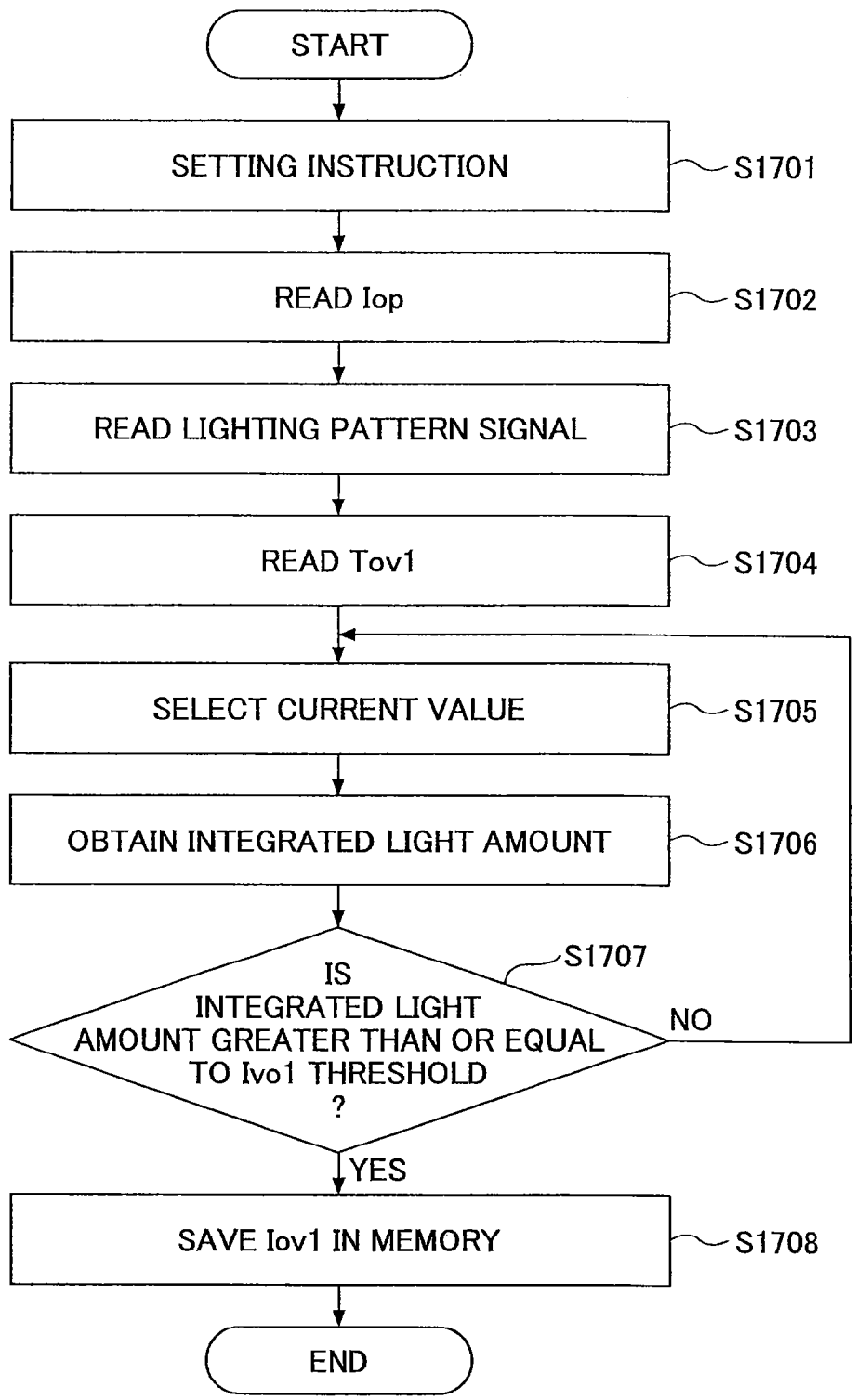

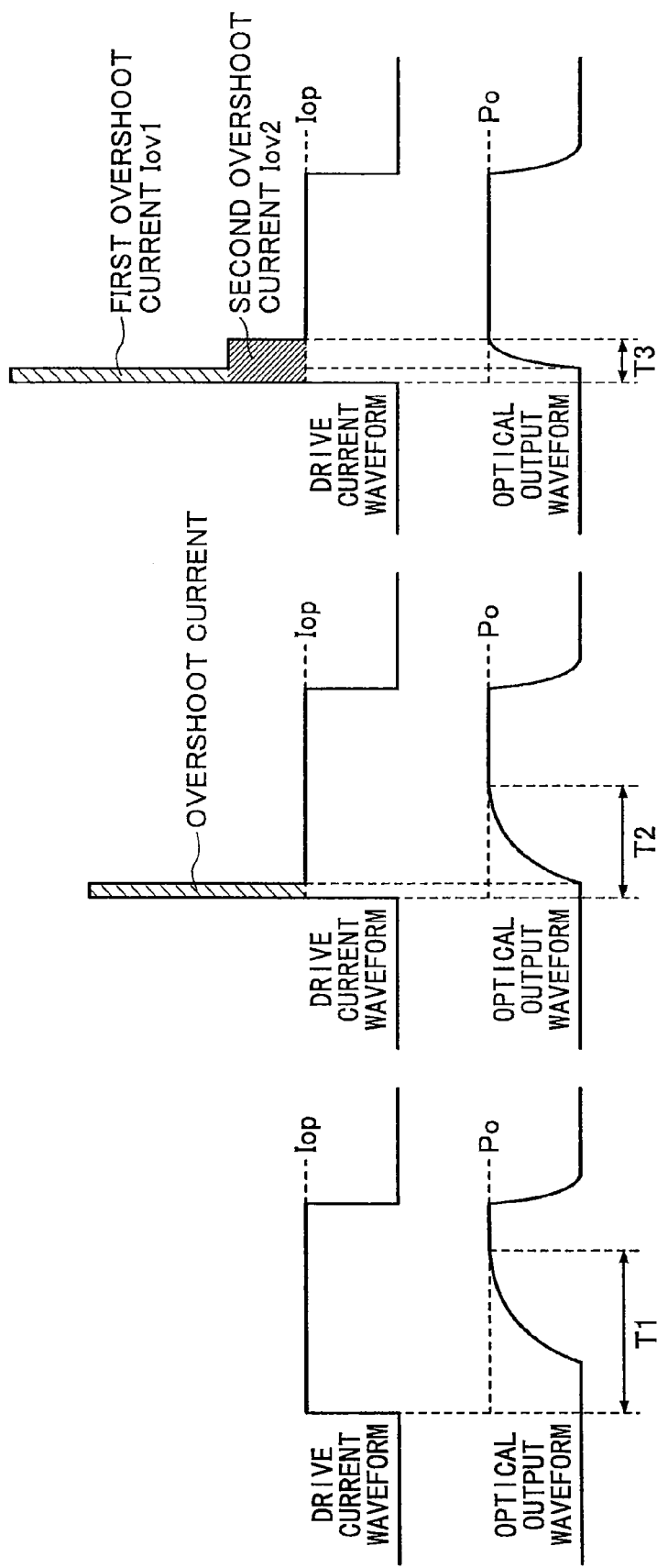

FIG.32

| ILD [mA] | VLDDOWN [V] | P [μW] |
|---:|---:|---:|
| 0 | 0 | 0.018 |
| 0.25 | 1.437 | 0.25 |
| 0.5 | 1.471 | 0.56 |
| 0.75 | 1.492 | 0.9 |
| 1 | 1.507 | 1.26 |
| 1.5 | 1.529 | 2.02 |
| 2 | 1.545 | 2.83 |
| 3 | 1.568 | 4.52 |
| 4 | 1.585 | 6.4 |
| 5 | 1.598 | 8.33 |

LIGHT SOURCE DRIVE CIRCUIT, OPTICAL SCANNING APPARATUS, SEMICONDUCTOR DRIVE CIRCUIT, AND IMAGE FORMING APPARATUS

TECHNICAL FIELD

The present invention relates to a light source drive circuit which generates a drive current including a predetermined current for obtaining a predetermined light amount from a light source and first and second overshoot currents which are added in synchronization with the predetermined current; an optical scanning apparatus; and an image forming apparatus.

The present invention also relates to a semiconductor laser drive circuit which controls an optical output of a semiconductor laser light source in a laser printer, an optical disk apparatus, a digital copier, an optical communication apparatus, etc.; and the image forming apparatus which includes the semiconductor laser drive circuit.

BACKGROUND ART

In a related-art image forming apparatus for use in product printing, etc., a predetermined optical output is obtained from a light source such as an LD (laser diode), etc., to expose a photosensitive body therewith and express a density of an image.

Now, it is known that, in the related art, a light emission delay time which depends on a response characteristic of a light source before obtaining a predetermined optical output from the light source occurs. Moreover, in the related art, it is known, for example, that, from a time at which a drive current is supplied to a light source to a time at which an optical output is detected, a light emission delay time occurs which depends on a parasitic capacitance of a circuit, etc., in which the light source is mounted.

Therefore, in the related-art image forming apparatus, when a time to cause an optical output is set to a short time of less than or equal to a few ns, for example, the optical output becomes less than a predetermined light amount, and the density of an image decreases, possibly causing unevenness in the image.

Thus, in the related art, schemes are provided to solve the above-described problems. For example, Patent document 1 discloses providing a charge and discharge circuit, wherein an overshoot current is generated by discharging at a time of a rise of an output of the LD (laser diode) to reduce a light emission delay time which depends on a response characteristic of a light source. Moreover, Patent document 2 discloses initially superposing a threshold current at a start time of lighting the LD and controlling a light emission amount thereof.

However, the overshoot current in Patent document 1 is generated primarily for reducing a delay time which depends on the response characteristic of the light source, so that it is difficult to improve the light emission delay time which depends on a parasitic capacitance. Moreover, in Patent document 2, while the threshold current is initially superimposed at the start time of lighting the LD, the threshold current is insufficient for charging a parasitic capacitance, so that it is difficult to sufficiently reduce a light emission delay time which depends on the parasitic capacitance. In particular, it becomes more difficult to reduce a delay time which depends on the parasitic capacitance in a circuit with a large parasitic capacitance and a light source with a large differential resistance.

A related-art semiconductor laser drive circuit is broadly classified into a non-bias technique and a bias technique.

In the non-bias technique, a bias current of a semiconductor laser is set to 0 and the semiconductor laser is driven by a pulse current which corresponds to an input signal.

Here, when the semiconductor laser with a large threshold current is driven by the non-bias technique, it requires some time before a carrier having a density which allows laser light emission is generated even when a drive current which corresponds to an input signal is applied to the semiconductor laser, leading to a light emission delay. The light emission delay does not become problematic when an input signal is sufficiently longer than a light emission delay time (when a light emission delay amount is negligible).

However, when it is necessary to drive the semiconductor laser at high speed as the laser printer, the optical disk apparatus, the digital copier, etc., increases in speed, only a pulse with a pulse width smaller than a desired pulse width may be obtained with the non-bias technique.

In order to solve the problems in the non-bias technique as described above, the bias technique is being proposed.

In the bias technique, the bias current of the semiconductor laser is set to a threshold current of the semiconductor laser and a pulse current which corresponds to the input signal is added to the bias current while applying the bias current continuously to drive the semiconductor laser.

For the bias technique, a current corresponding to a light emission threshold (a light emission threshold current) is applied to the semiconductor laser in advance, eliminating the light emission delay time.

However, for the bias technique, electricity is being turned on continuously around the light emission threshold even when the semiconductor laser does not emit light (normally 200 µWs to 300 µWs). Therefore, for optical communications using the semiconductor laser which is driven by the bias technique, an extinction ratio becomes small. The small extinction ratio of the semiconductor laser causes surface staining of an image in the laser printer, the optical disk apparatus, digital copier, etc., that uses the semiconductor laser for the light source.

In the field of optical communications, in order to solve the above-described problems, a configuration is being proposed of basically using a non-bias technique and applying a light emission threshold current immediately before causing light to be emitted (see Patent documents 3 and 4, for example).

However, recently, image forming apparatuses which use a 650 nm red semiconductor laser, a 400 nm ultraviolet semiconductor laser, etc., in the quest for an increased resolution in the laser printer, the optical disk apparatus, the digital copier, etc., are being put to practical use.

Moreover, for an increased speed in processing and an increased resolution of images, semiconductor lasers such as a VCSEL (vertical cavity surface emitting laser) in which it is easy to integrate multiple light sources are also being put to practical use.

These semiconductor lasers have a characteristic that more time, relative to the related-art 1.3 µm-band, 1.5 µm-band, and 780 µm-band semiconductor lasers, is required before a carrier having a density which allows laser light emission is generated due to reasons such as a large differential resistance thereof.

Moreover, these semiconductor lasers are able to yield only a pulse width which is smaller than a desired pulse width even with the bias technique. Therefore, a semiconductor laser driving method in the light of these characteristics is needed.

Furthermore, in a case of seeking to cause a low density to be manifested by an optical output of a short time (for example, less than or equal to several ns), a light emission output does not reach a peak strength of a beam spot. Therefore, there is a problem that, in the above-described case, the density becomes unnecessarily low, so as not to be able to cause the density to be manifested correctly.

There is also known a technique of superimposing a differential pulse at a time of a rise of a laser drive signal applied to the semiconductor laser in order to solve the above-described problem (see Patent document 5, for example).

However, with this method, a peak of the differential pulse cannot be controlled, so there is a high risk of destroying the semiconductor laser. Moreover, the time in which the differential pulse is superimposed also depends on a differential waveform. Thus, with this method, there is a problem that it is not necessarily the case that a subsequent tone manifestation increases linearly even when an initial ultra low density may be corrected for.

A technique is being proposed of providing a high-speed and high-accuracy semiconductor laser drive control and conducting a correction using four currents of a bias current; a light emission threshold current; a light emission current; and a drive auxiliary current (see Patent document 2, for example).

With the technique proposed in Patent document 2, an ideal shape of an almost square wave as an optical waveform may be obtained without question.

However, with the technique proposed in Patent document 2, a waveform of a pulse of an output signal may become narrower than a waveform of a pulse of an input signal depending on set values of the bias current and the light emission threshold current, or, in other words, a pulse narrowing phenomenon may occur.

Now, as the semiconductor lasers for use in the image forming apparatus, etc., a semiconductor laser array, the VCSEL, etc., are often used. The semiconductor lasers have various characteristics depending on the structure, wavelength characteristics, output characteristics, etc.

For example, the 650 nm-band red semiconductor laser generally has a differential resistance which is larger than that of the 780 nm-band infrared semiconductor laser. Therefore, with the red 650 nm-band red semiconductor laser, a square wave may not be obtained at high speed, so that waveform dullness may occur depending on a configuration of a driving circuit, substrate, etc.

Moreover, even with a semiconductor laser which emits an infrared light, the VCSEL, for example, has a differential resistance of a few hundreds of Os, which is very large relative to that of an edge type laser due to differences in structure. Therefore, using the VCSEL results in a CR time constant by a terminal capacitance of the VCSEL itself; a parasitic capacitance of a substrate; and a terminal capacitance of a driver. In other words, the VCSEL itself may not yield a predetermined response waveform even when mounted to a substrate even though it has a device characteristic of being able to modulate at high speed or a cutoff frequency of Ft.

Furthermore, with the semiconductor laser, there is a large fluctuation in a light emission strength relative to a current amount between an LED (light emitting diode) region up to the threshold current and an LD region on and above the threshold current. Here, when driving the image forming apparatus by increasing a current to a light emission strength from a state in which the bias current of less than or equal to the threshold current is applied, the light emission strength in the LED region is low. In other words, this case causes a light emission delay relative to a drive signal.

PATENT DOCUMENTS

Patent document 1: JP4349470B;
Patent document 2: JP3466599B;
Patent document 3: JP4-283978A;
Patent document 4: JP9-83050A; and
Patent document 5: JP5-328071A.

DISCLOSURE OF THE INVENTION

In order to solve the above-described problems, an object of the present invention is to provide a light source drive circuit, an optical scanning apparatus, and an image forming apparatus that make it possible to reduce a light emission delay time of an optical output and improve a response characteristic.

Another object of the present invention is to provide a semiconductor laser drive circuit which eliminates a light emission delay while obtaining a predetermined response waveform for driving a semiconductor laser.

According to an embodiment of the present invention, a light source drive circuit which drives a light source is provided, including a drive current generating unit which generates a drive current, the driving current including a predetermined current for obtaining a predetermined light amount from the light source; and first and second overshoot currents which are applied to the predetermined current in synchronization thereto; and a control unit which sets, to the drive current generating unit, a value of the first overshoot current to a fixed value, and a value of the second overshoot current in accordance with a light amount output from the light source.

According to another embodiment of the present invention, a semiconductor laser drive circuit which drives and modulates a semiconductor laser is provided, including a current source which supplies a drive current for driving and lighting the semiconductor laser; a first overshoot current source which supplies a current at a time of a rise of the drive current; and a second overshoot current source which supplies a current at the time of the rise of the drive current, wherein a time in which the first overshoot current source supplies the current is a time which is shorter than a time in which the semiconductor laser responds to the drive current; and a time in which the second overshoot current source supplies the current is longer than the time in which the first overshoot current source supplies the current and is shorter than the time in which the semiconductor laser responds to the drive current.

The present invention makes it possible to reduce a light emission delay time of an optical output and to improve a response characteristic.

The present invention also makes it possible to eliminate a light emission delay while obtaining a predetermined response waveform for driving the semiconductor laser.

BRIEF DESCRIPTION OF THE DRAWINGS

Other objects, features, and advantages of the present invention will become more apparent from the following detailed descriptions when read in conjunction with the accompanying drawings, in which:

FIG. 17 is a flowchart for explaining a process of an Iov1 value setting unit in the evaluation apparatus;

FIGS. 18A to 18C are first diagrams for explaining an advantageous effect of the first embodiment;

FIG. 32 is a table illustrating an output and a drop voltage when the weak current is applied to the semiconductor laser;

BEST MODE FOR CARRYING OUT THE INVENTION

Below, embodiments of the present invention are described using the drawings.

Figure 1:
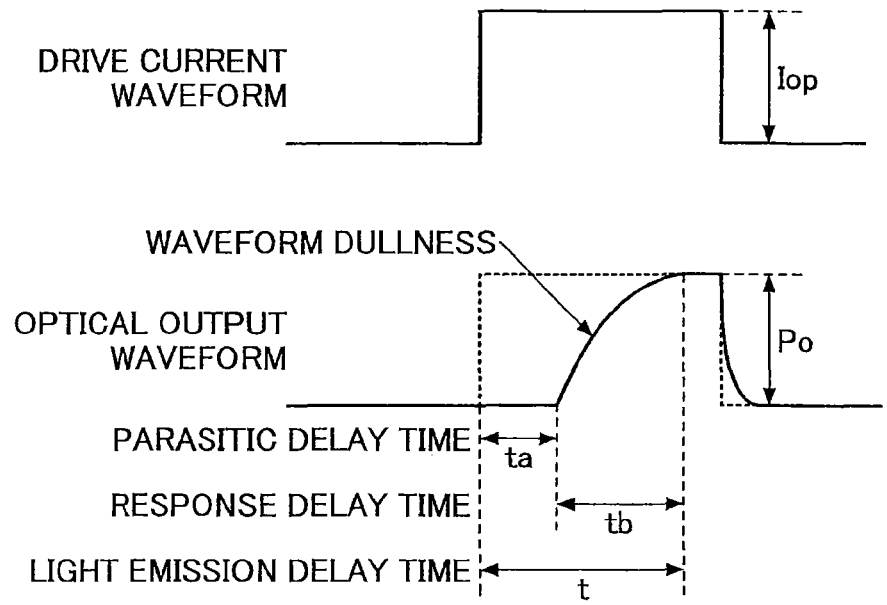
FIG. 1 is a view for explaining a light emission delay time of a light source.

FIG. 1 is a view for explaining a light emission delay time of a light source. FIG. 1 shows a drive current waveform supplied to a light source; and an optical output waveform of the light source to which the drive current is supplied. In FIG. 1, an output of the light source is shown in a light amount.

A light emission delay time t shown in FIG. 1 shows a time from when supplying of the drive current to the light source is started to when the light source outputs a predetermined light amount Po. The predetermined light amount Po is a target light amount set in advance. The light emission delay time t is a sum of a parasitic delay time ta and a response delay time tb. The parasitic delay time ta is a charging time to a parasitic capacitance produced in parallel with a light source that is present in a wiring which connects the light source and a circuit, or an in-package wiring of the light source. Details of the parasitic delay time ta are described below. As a charge amount and the charging time increase as the parasitic capacitance increases, the parasitic delay time ta tends to increase accordingly.

The response delay time tb is a response time from when the light source starts light emission with a predetermined current Iop being supplied to the light source to when the predetermined light amount Po is output. The predetermined current Iop is a current whose value is set in advance for obtaining the predetermined light amount Po. The response delay time tb results from a characteristic of the light source and has an impact due to a differential resistance, for example. The larger the differential resistance the more difficult it becomes for a current to flow into the light source, so that the response delay time tb tends to increase accordingly.

In practice, the light emission delay time t, which is up to when the drive current is supplied to the light source, includes a wiring delay time, etc., on a circuit board, other than the parasitic delay time ta and the response relay time tb. However, in the description of the present specification, the wiring delay time, etc., is ignored, so that the light emission delay time t is set to be a sum of the parasitic delay time ta and the response delay time tb. Moreover, in the description of the present specification, respective falls of the drive current waveform and the optical output waveform are shown to be aligned.

Figure 2:
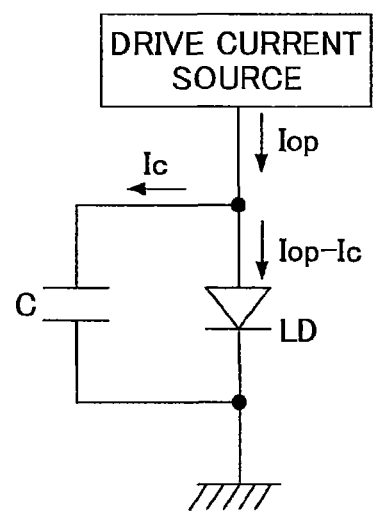
FIG. 2 is a view for explaining a parasitic capacitance of the light source.

Below the parasitic capacitance is explained with reference to FIG. 2. FIG. 2 is a view for explaining the parasitic capacitance of the light source.

In the present embodiment, the light source is set to be an LD (laser diode), for example. In the LD shown in FIG. 2, when a predetermined current Iop is supplied, a predetermined light amount Po is output. C shown in FIG. 2 is a parasitic capacitance. The parasitic capacitance C includes a parasitic capacitance which is produced, when the LD is mounted on a circuit substrate, etc., together with a circuit such as an LD driver, etc., in a wiring which connects the LD and the circuit such as the LD driver, etc. Moreover, when the LD and the circuit including the LD driver, etc., are integrated into a package, the parasitic capacitance C also includes a parasitic capacitance of the package, etc.

When the predetermined current Iop is supplied to the LD, a current Ic, which is a portion of the predetermined current Iop, is supplied to the parasitic capacitance C to charge the parasitic capacitance C. While the parasitic capacitance C is being charged by the predetermined current Iop, a current (Iop−Ic), which is a portion of the predetermined current Iop, is supplied to the LD. Then, when charging of the parasitic capacitance C is completed, the predetermined current Iop is supplied to the LD. In other words, during the time of charging the parasitic capacitance C by the current Ic, only the portion (Iop−Ic) of the predetermined current Iop is supplied, so that it becomes a time during which no optical output is obtained. This time during which no optical output is obtained becomes a parasitic delay time.

Figure 3:
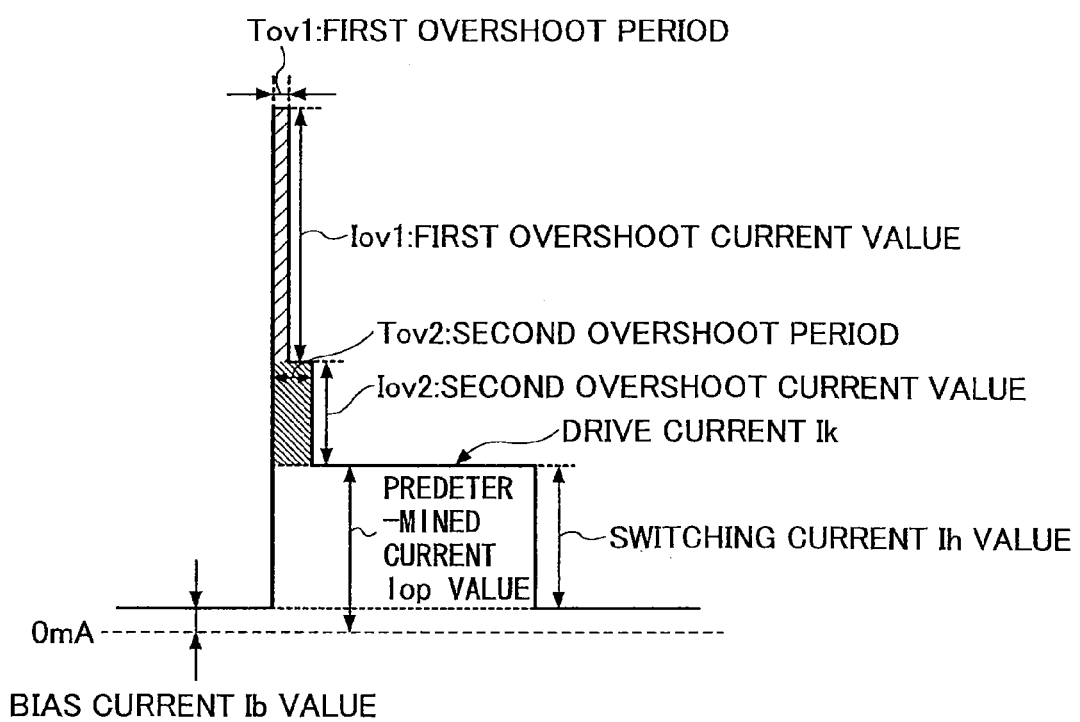
FIG. 3 is a view for explaining a drive current which is supplied to the light source from a light source drive circuit.

Next, a drive current which is supplied to the light source from a light source drive circuit according to the present invention is described with reference to FIG. 3. FIG. 3 is a view for explaining the drive current which is supplied to the light source from the light source drive circuit. FIG. 3 shows a drive current waveform supplied to the light source from the light source drive circuit.

A drive current Ik which is supplied to the light source includes the predetermined current Iop for obtaining the predetermined light amount Po from the light source; and a first overshoot current Iov1 and a second overshoot current Iov2 that are superposed to the predetermined current Iop in synchronization with a rise of the predetermined current Top. The predetermined current Iop includes a switching current Ih and a bias current Ib.

The first overshoot current Iov1 is a current set based on the parasitic delay time ta. The parasitic delay time ta may be predetermined from a circuit substrate, etc., on which the light source is mounted. Thus, a value of the first overshoot current Iov1 and an applying period (below-called a "first overshoot period" Tov1) may be arranged to be a fixed value which is set in alignment with the predetermined parasitic delay time ta. According to the present invention, the first overshoot period Tov1 is set to be a period which is shorter than the parasitic delay time ta, or in other words, the first overshoot period Tov1 is set to be a period which is shorter than a period from when the predetermined current Iop is supplied to the light source to when the light source starts light emission. Details of a method of setting the value of the first overshoot current Iov1 and the first overshoot period Tov1 are described below.

The second overshoot current Iov2 is a current whose value is set based on the response delay time tb. The response delay time tb varies with a response characteristic of the light source. For example, the response characteristic may differ when the light source deteriorates. Moreover, the response characteristic may also differ depending on variations at a time of manufacturing for each light source, etc. Then, a value of the second overshoot current Iov2 is set to be a varying value which is adjusted in accordance with a response characteristic of the light source. An applying period of the second overshoot current Iov2 (below-called a "second overshoot period" Tov2) is a fixed value.

According to the present invention, the drive current Ik as shown in FIG. 3 is generated and supplied to the light source, making it possible to reduce the parasitic delay time ta with the first overshoot current Iov and to shorten the response delay time tb with the second overshoot current Iov2. Moreover, a value of the first overshoot current Iov1 is arranged to be a fixed value and only a value of the second overshoot current Iov2 is adjusted, facilitating control with respect to reducing of the light emission delay time t and making it possible to improve the response characteristic of the light source in a short time.

(First Embodiment)

Figure 4:
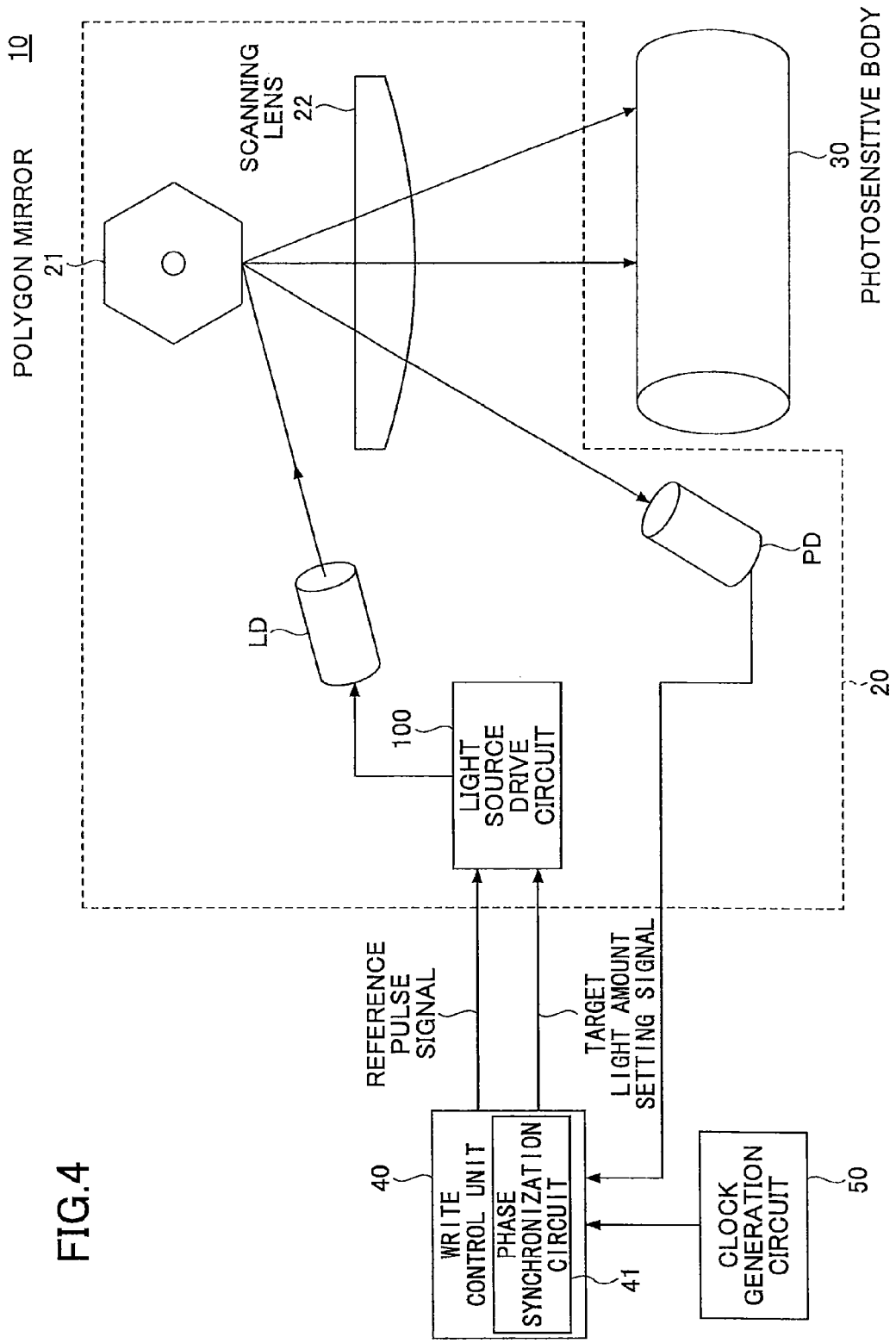
FIG. 4 is a diagram for explaining a schematic configuration of an image forming apparatus according to a first embodiment.

A description is given below with regard to a first embodiment of the present invention with reference to the drawings. FIG. 4 is a diagram for explaining a schematic configuration of an image forming apparatus according to the first embodiment.

An image forming apparatus 10 according to the present embodiment includes an optical scanning apparatus 20; a photosensitive body 30; a write control unit 40; and a clock generation circuit 50.

The optical scanning apparatus 20 according to the present embodiment includes a polygon mirror 21; a scanning lens 22; a light source drive circuit 100, an LD (laser diode; a semiconductor laser) which is a light emitting element (light source); and a PD (photo detector) to be a light receiving element. While the light source is set to be the LD according to the present embodiment, it is not limited thereto. The light source may be a semiconductor laser array (LDA; laser diode array), a VCSEL (vertical cavity surface emitting laser), etc.

A laser light which is emitted from the LD is scanned by the rotating polygon mirror 21 and irradiated onto the photosensitive body 30, which is a medium to be scanned, via the scanning lens 22. A laser light which is irradiated becomes a light spot on the photosensitive body 30, thereby forming an electrostatic latent image on the photosensitive body 30. Moreover, the polygon mirror 21 irradiates, onto the PD, the laser light each time scanning of one line is completed. When the laser light is irradiated thereon, the PD converts the irradiated laser light into an electrical signal and inputs this electrical signal into a phase synchronization circuit 41 included in the write control unit 40. When the electrical signal is input therein, the phase synchronization circuit 41 generates a pixel clock corresponding to the following one line. Moreover, a high-frequency clock signal is input from the clock generation circuit 50 into the phase synchronization circuit 41, thereby achieving phase synchronization of the pixel clock.

The write control unit 40 supplies a reference pulse signal to the light source drive circuit 100 in accordance with the pixel clock generated. Moreover, the write control unit 40 supplies a target light amount setting signal to the light source drive circuit 100, driving the LD. In this way, an electrostatic latent image of image data is formed on the photosensitive body 30.

Figure 5:
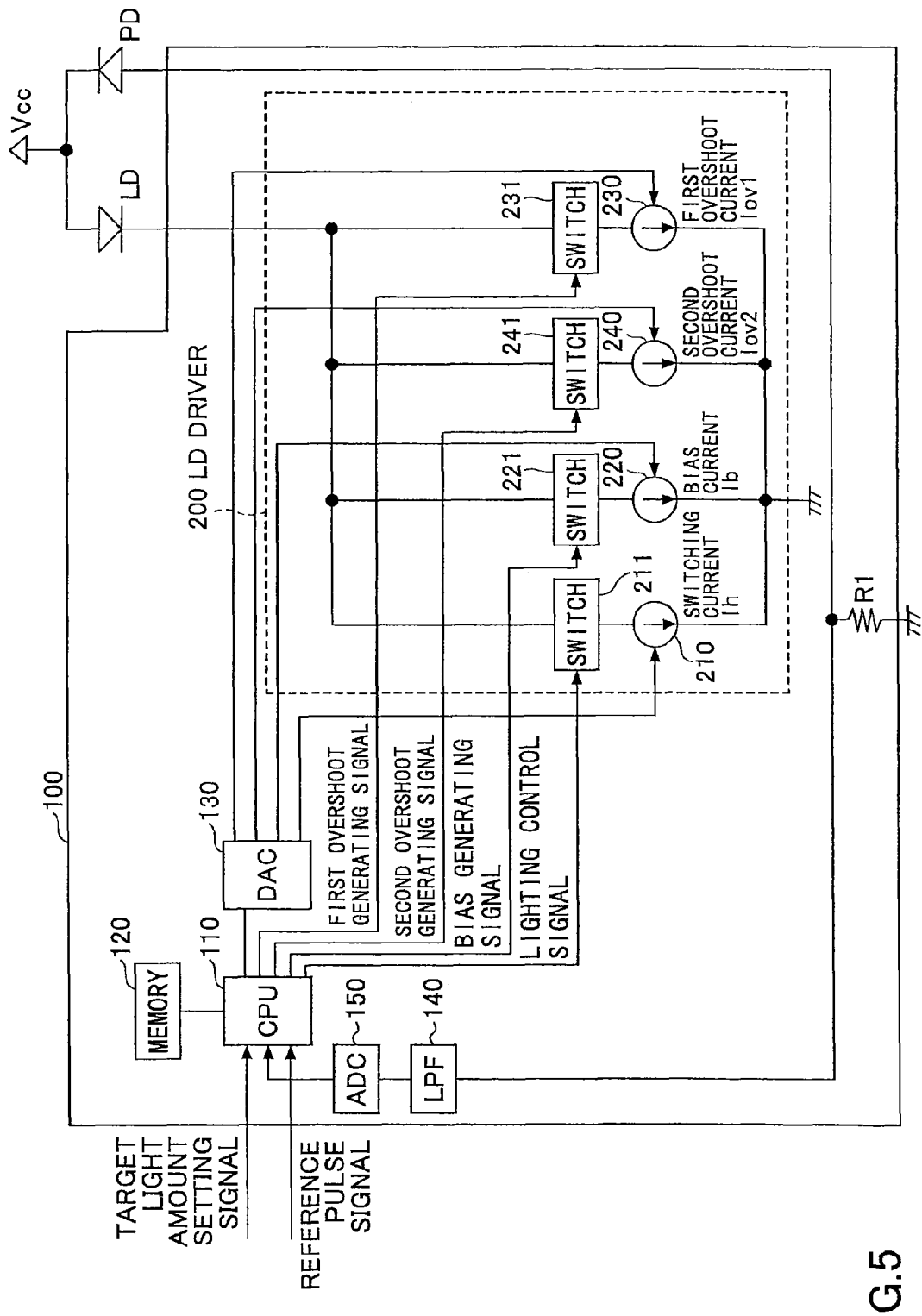
FIG. 5 is a diagram for explaining the light source drive circuit according to the first embodiment.

Below the light source drive circuit 100 of the present embodiment is explained with reference to FIG. 5. FIG. 5 is a diagram for explaining a light source drive circuit according to the first embodiment.

The light source drive circuit 100 according to the present embodiment includes a CPU (central processing unit) 110; a memory 120; a DAC (digital to analog converter) 130; an LPF (low-pass filter) 140; an ADC (analog to digital converter) 150; an LD driver 200; and a resistor R1. The resistor R1 does not have to be included in the light source drive circuit 100. In this case, the resistor R1 is provided outside the light source drive circuit 100.

The light source drive circuit 100 according to the present embodiment that is connected between the LD and the PD, controls driving of the LD based on the electrical signal output from the PD in accordance with a light amount of the PD.

The CPU 110 controls various operations of the light source drive circuit 100. The memory 120 stores various values, etc., for use in the operations of the light source drive circuit 100. Details of the values stored in the memory 120 and functions of the CPU 110 are described below.

The DAC 130 converts a signal output from the CPU 110 into analog values. The LPF 140 passes a signal of a predetermined band out of electrical signals output from the PD. The ADC 150 converts the electrical signal output from the LPF 140 into digital values.

The LD driver 200 generates a drive current to be supplied to the LD based on the reference pulse signal and the target light amount setting signal and controls a light emission timing of the LD. The LD driver 200 according to the present embodiment causes the drive current of the LD to overshoot.

The light source drive circuit 100 according to the present embodiment performs control of the drive current Ik with the CPU 110 and the LD driver 200. More specifically, the light source drive circuit 100 calculates a value of the second overshoot current Iov2 in accordance with an optical output of the LD. Then, the light source drive circuit 100 generates the drive current waveform in which the first overshoot current Iov1, which is set in advance; and the second overshoot current Iov2 are synchronized to the reference pulse signal.

Below, the LD driver 200 according to the present embodiment is explained. The LD driver 200 according to the present embodiment includes a switching current source 210; a bias current source 220; a first overshoot current source 230; a second overshoot current source 240; and switches 211, 221, 231, and 241.

The switching current source 210, the bias current source 220, the first overshoot current source 230, and the second overshoot current source 240 generate a drive current Ik for the LD. The drive current Ik according to the present embodiment is a current in which current values output from the respective current sources are added.

The switching current source 210 generates a predetermined switching current Ih based on a lighting control signal from the CPU 110. The switching current source 210 is connected to the LD via the switch 211. With the switch 211, which includes a transistor, etc., for example, on/off is controlled based on a lighting control signal supplied from the CPU 110. Moreover, a value of the switching current Ih is set in accordance with instructions from the CPU 110.

The bias current source 220 generates a predetermined bias current Ib based on a bias generating signal from the CPU 110. The bias current source 220 is connected to the LD via the switch 221. With the switch 221, which includes a transistor, etc., for example, on/off is controlled based on the bias generating signal supplied from the CPU 110. Moreover, a value of the bias current Ib is set in accordance with instructions from the CPU 110.

The first overshoot current source 230 generates the first overshoot current Iov1 as a first auxiliary drive current as auxiliary to the switching current Ih at a rise of the lighting control signal. The first overshoot current source 230 is connected to the LD via the switch 231. With the switch 231, which includes a transistor, etc., for example, on/off is controlled based on a first overshoot generating signal supplied from the CPU 110. According to the present embodiment, a period during which the first overshoot generating signal is on is the first overshoot period Tov1. More specifically, the switch 231 according to the present embodiment is set to be on from a rise of the lighting control signal to the first overshoot period Tov1.

The second overshoot current source 240 generates the second overshoot current Iov2 as a second auxiliary drive current as auxiliary to the switching current Ih at a rise of the lighting control signal. The second overshoot current source 240 is connected to the LD via the switch 241. With the switch 241, which includes a transistor, etc., for example, on/off is controlled based on a second overshoot generating signal supplied from the CPU 110. According to the present embodiment, a period during which the second overshoot generating signal is on is the second overshoot period Tov2. More specifically, the switch 241 according to the present embodiment is set to be on from a rise of the lighting control signal to the second overshoot period Tov2.

Figure 6:
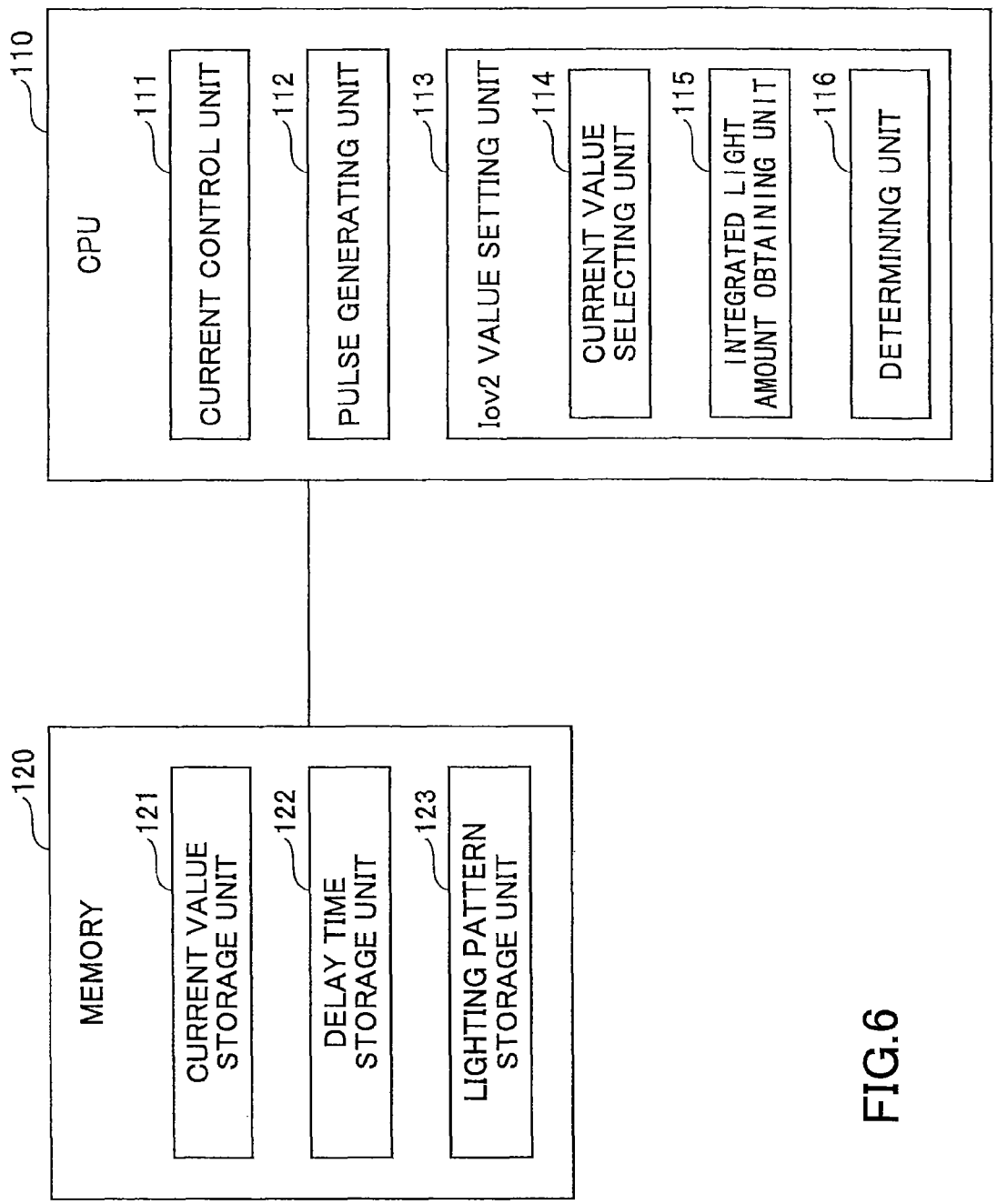
FIG. 6 is a diagram for explaining values stored in a memory and a functional configuration of a CPU.

Below functions of the CPU 110 according to the present embodiment and the values stored in the memory 120 according to the present embodiment are explained with reference to FIG. 6. FIG. 6 is a diagram for explaining the values stored in the memory and a functional configuration of the CPU.

The CPU 110 according to the present embodiment includes a current control unit 111; a pulse generating unit 112; and an Iov2 value setting unit 113.

The memory 120 includes a current value storage unit 121; a delay time storage unit 122; and a lighting pattern storage unit 123. Setting values in various current sources included in the light source drive circuit 100 are stored in the current value storage unit 121. More specifically, values of the switching current Ih; the bias current Ib; and the first overshoot current Iov1 are set in the current value storage unit 121.

A delay time for determining the first overshoot period Tov1 and the second overshoot period Tov2 is stored in the delay time storage unit 122. A lighting pattern signal for the LD that is to be used when calculating the second overshoot current Iov2 by the below-described Iov2 value setting unit 113 is stored in the lighting pattern storage unit 123.

In the CPU 110, the current control unit 111 obtains setting values of various current sources that are stored in the current value storage unit 122 and causes currents corresponding to the setting values to be output via the DAC 130 to the various current sources.

The pulse generating unit 112 is a signal generating unit which generates a first overshoot generating signal and a second overshoot generating signal based on the reference signal and the delay time stored in the delay time storage unit 122. Moreover, the pulse generating unit 112 may generate a bias generating signal and a lighting pattern signal. The lighting pattern signal according to the present embodiment is a signal which is supplied to the switch 211 only when calculating the second overshoot current Iov2 by the Iov2 value setting unit 113. With respect to the switch 211, when the image forming apparatus 10 performs an image forming operation, on/off thereof is controlled by a lighting control signal based on image data supplied from the write control unit 40.

The Iov2 value setting unit 113 calculates and sets the second overshoot current Iov2 based on an output of the PD. The Iov2 value setting unit 113 according to the present embodiment includes a current value selecting unit 114; an integrated light amount obtaining unit 115; and a determining unit 116. Details of the Iov2 value setting unit 113 are described below.

Figure 7:
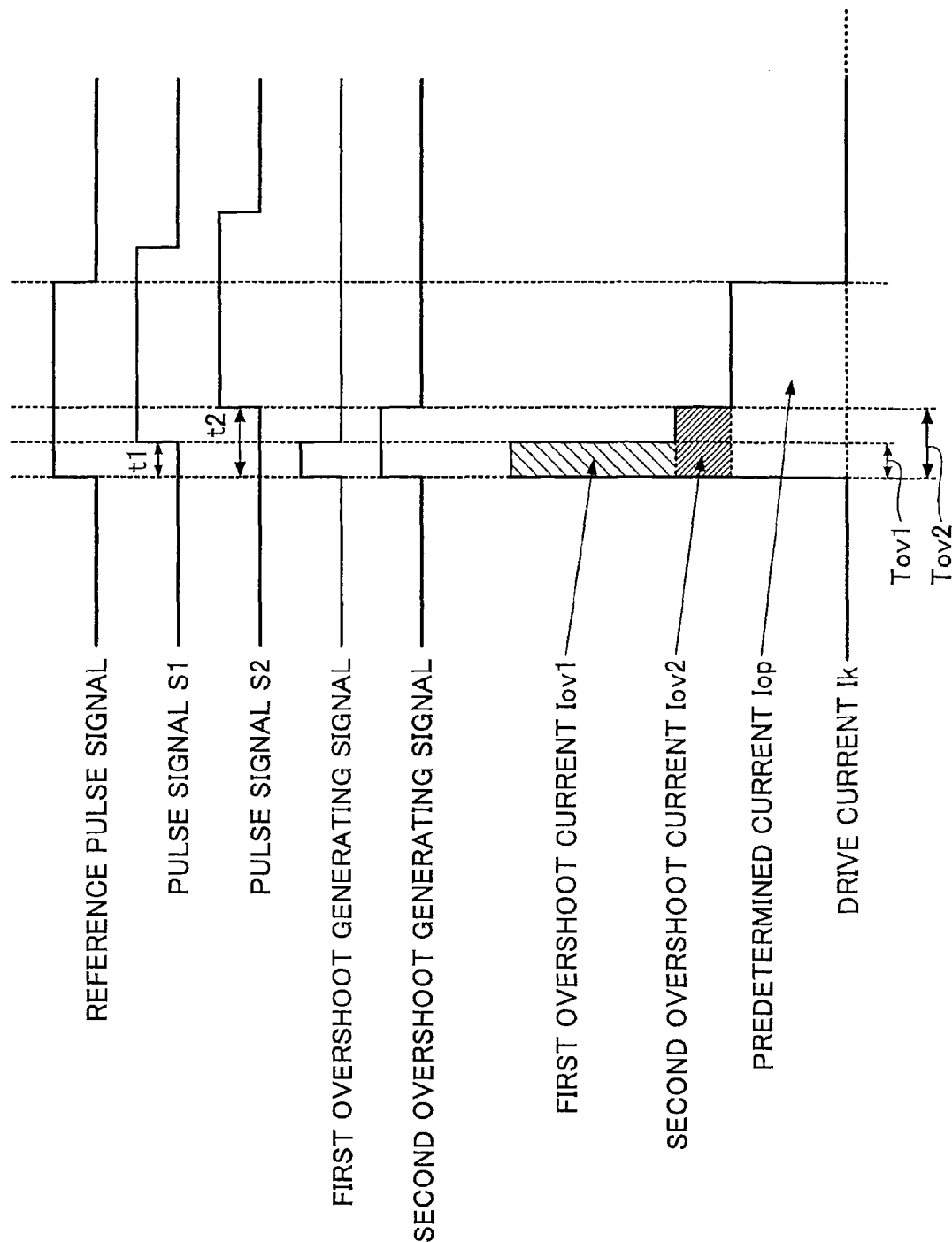
FIG. 7 is a diagram for explaining generation of first and second overshoot generating signals.

Next, with reference to FIG. 7, generation of the first and second overshoot generating signals by the pulse generating unit 112 according to the present embodiment is explained.

FIG. 7 is a diagram for explaining the generation of the first and second overshoot generating signals.

The pulse generating unit 112 according to the present embodiment obtains, for example, a delay time t1 which corresponds to the first overshoot period Tov1 and a delay time t2 which corresponds to the second overshoot period Tov2 from a delay time storage unit 122. Then, the pulse generating unit 112 generates a pulse signal S1, which is the reference pulse signal delayed by the delay time of t1 in seconds; and a pulse signal S2, which is the reference pulse signal delayed by the delay time of t2 in seconds. For example, when the reference pulse signal is at a high level and the pulse signal S1 is at a low level, the pulse generating unit 112 generates a first overshoot signal which is on (which is at a high level) for the first overshoot period Tov1. Moreover, when the reference pulse signal is at the high level and the pulse signal S2 is at the low level, the pulse generating unit 112 generates a second overshoot generating signal which is on (which is at a high level) for the second overshoot period Tov2.

While the delay times t1 and t2 are stored in the memory 120 for the pulse generating unit 112 according to the present embodiment, it is not limited thereto. The delay times t1 and t2 according to the present embodiment may be obtained in a method different from those described in the above. For example, the pulse generating unit 112 according to the present embodiment may simply generate pulse signals S1 and S2 by an inverter sequence or a buffer sequence. Moreover, according to the present embodiment, a reference pulse signal may be delayed by a low pass filter including a resistor, a capacitor, etc., after which waveform-rectified signals may be used as the pulse signals S1 and S2. In either case, changing a delay amount may be easily realized by changing the number of steps or a filter coefficient.

Figure 8:
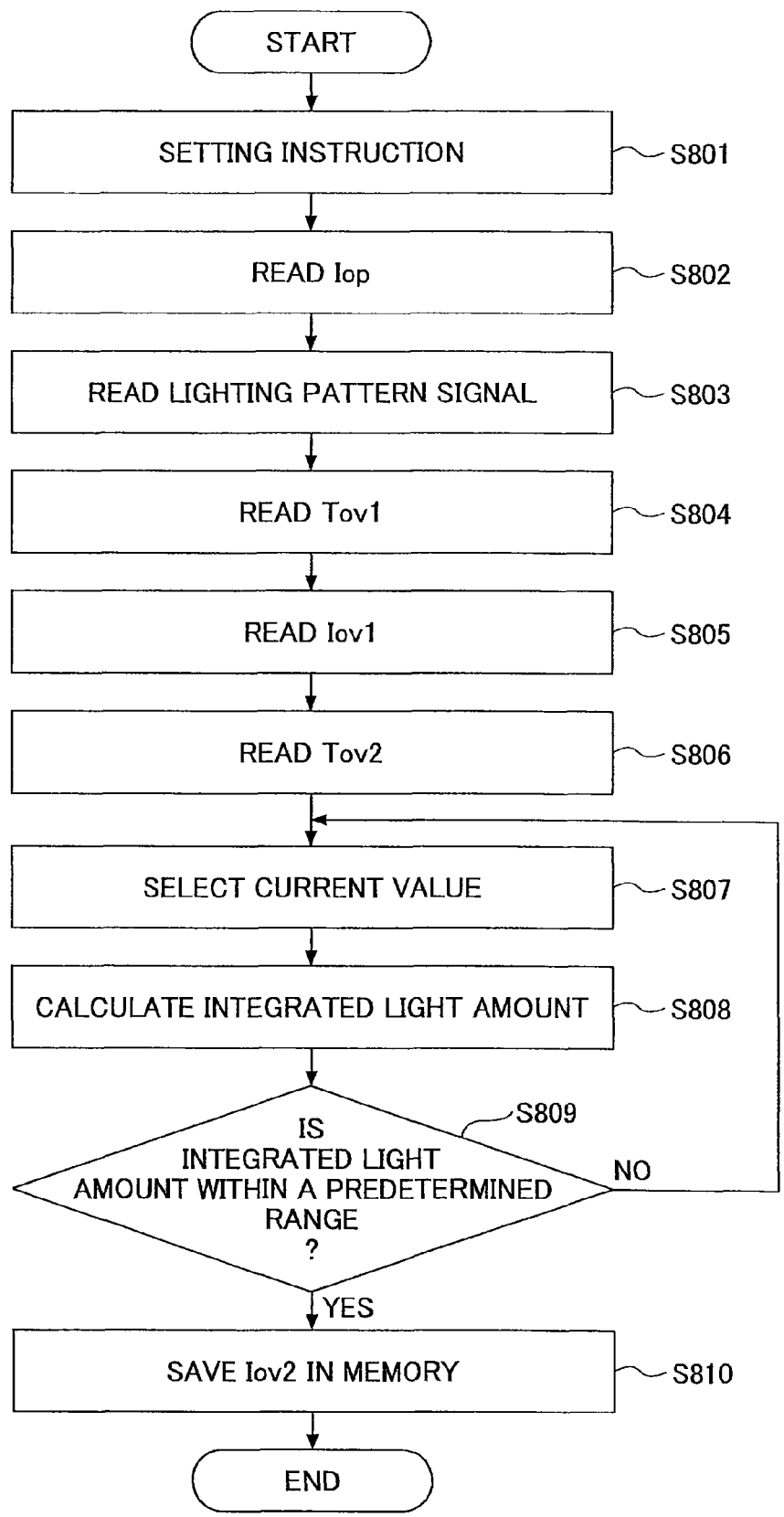
FIG. 8 is a flowchart for explaining a process of an Iov2 value setting unit according to the first embodiment.

Next, with reference to FIG. 8, setting of the second overshoot current Iov2 by the Iov2 value setting unit 113 according to the present embodiment is explained. FIG. 8 is a flowchart for explaining a process of the Iov2 value setting unit according to the first embodiment.

When an integrated light amount ratio of an output waveform of the PD when a light is caused to be emitted from the LD based on a lighting pattern signal falls within a predetermined range, the Iov2 value setting unit 113 according to the present embodiment sets a current value as a value of the second overshoot current Iov2. The integrated light amount ratio is a value indicating a proportion of an integrated light amount of an output waveform of the PD relative to an integrated light amount corresponding to one period of the lighting pattern signal.

First, the CPU 110 initially accepts an instruction for setting the second overshoot current Iov2 (step S801). According to the present embodiment, the setting instruction is accepted when starting supplying of a drive current Ik to the LD again after supplying of the drive current Ik from the light source drive circuit 100 to the LD is stopped. This setting instruction may be provided from a main CPU (not shown) which controls the whole operation of the image forming apparatus 10 to the CPU 110, for example. More specifically, according to the present embodiment, the setting instruction is accepted, for example, when the image forming apparatus 10 is activated from a sleep mode, or when a door provided in a housing of the image forming apparatus 10 is opened and then closed, etc.

Next, the Iov2 value setting unit 113 reads a value of a predetermined current Iop from the current value storage unit 121 (step S802). Next, the Iov2 value setting unit 113 reads a lighting pattern signal from the lighting pattern signal storage unit 123 (step S803). The lighting pattern signal according to the present embodiment is a signal which is generated in advance such as to turn on the LD corresponding to one pixel and turn off the LD corresponding to one pixel.

Next, the Iov2 value setting unit 113 reads the delay time t1, or, in other words, the first overshoot period Tov1 from the delay time storage unit 122 (step S804). Next, the Iov2 value setting unit 113 reads a value of the first overshoot current Iov1 from the current value storage unit 121 (step S805). Next, the Iov2 value setting unit 113 read the delay time t2, or, in other words, the second overshoot period Tov2 from the delay time storage unit 122 (step S806).

Next, the Iov2 value setting unit 113 outputs, to the DAC 130, a current value selecting signal for selecting a current value by the current value selecting unit 114 (step S807). The current value selecting unit 114 selects in an ascending order of a current value out of current values which can be output in the DAC 130.

When the current value selecting signal is received from the CPU 110, the DAC 130 converts the selected current value to an analog value to output the converted analog value to the second overshoot current source 240. The second overshoot current source 240 supplies a selected current value to the LD. Then, the pulse generating unit 112 supplies a second overshoot generating signal which is synchronized with a rise of the lighting pattern signal. The second overshoot generating signal turns on the switch 241 only for the second overshoot period Tov2 read in step S806.

Next, the Iov2 value setting value 113 calculates an integrated light amount ratio of an output waveform of the PD by the integrated light amount calculating unit 115 (step S808). Next, the Iov2 value setting unit 113 determines whether the calculated integrated light amount ratio is within a predetermined range by the determining unit 116 (step S809).

When the integrated light amount ratio is within a predetermined range in step S809, the Iov2 value setting unit 113 sets the then selected current value as a value of the second overshoot current Iov2. In step S809, when the integrated light amount ratio is not within the predetermined range, the Iov2 value setting unit 113 returns to step S807, and selects the second largest current value.

Figure 9:
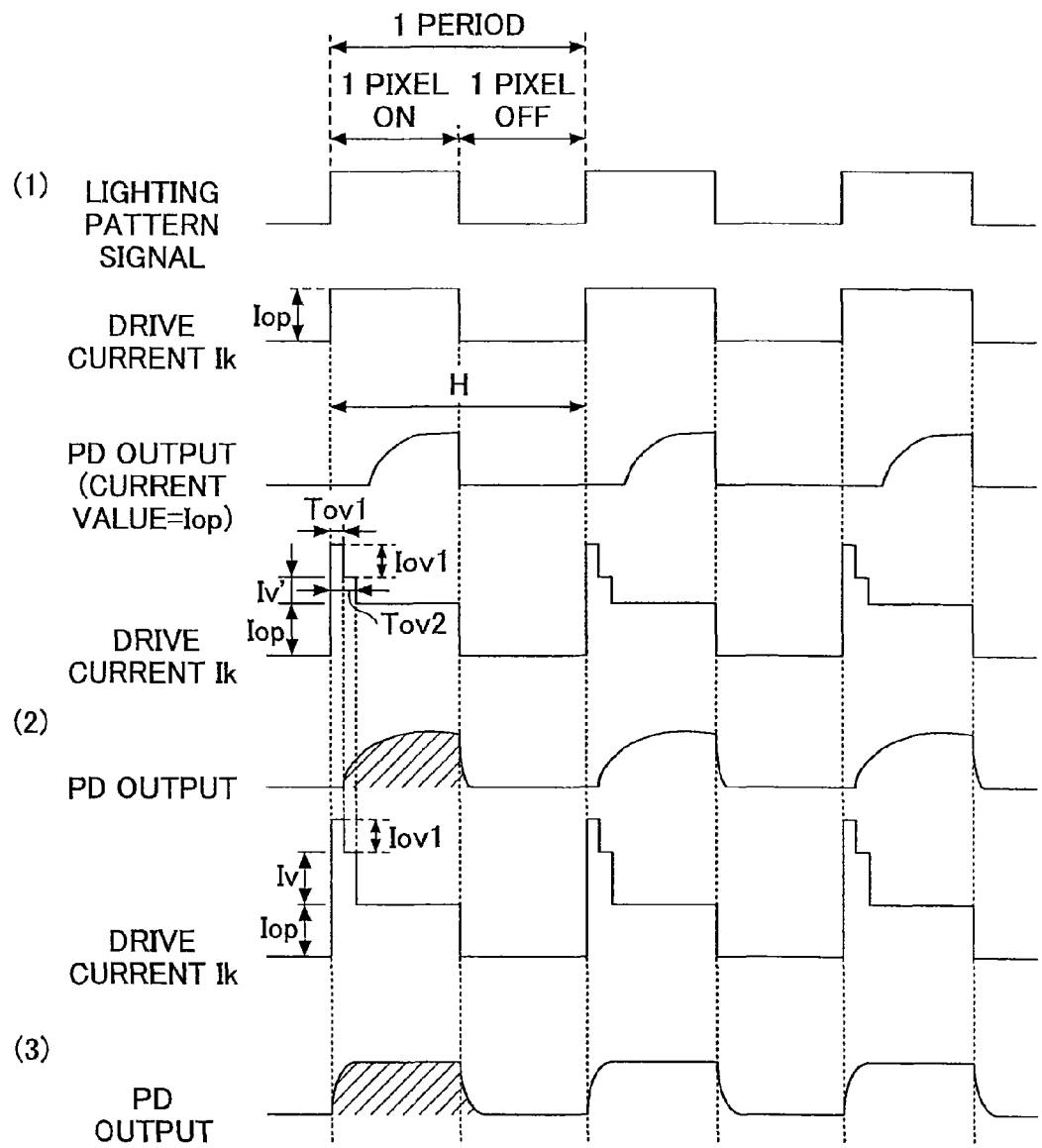
FIG. 9 is a diagram for explaining a second overshoot current Iov.

Below, with reference to FIG. 9, the second overshoot current Iov2 is further explained. FIG. 9 is a diagram for explaining the second overshoot current Iov2.

FIG. 9 shows a case in which a predetermined range is set to ±50 with 50% as a center value, for example, in order to make the output waveform of the PD close to an ideal waveform without a light emission delay. The predetermined range, which is a preset value, may be arbitrarily set.

FIG. 9, in (1), shows an output waveform of the PD in case a current value has not been selected by the current value selecting unit 114 and the drive current Ik becomes the predetermined current Iop which is synchronized with a lighting pattern signal. In this case, an integrated light amount ratio of the output waveform of the PD in a time period H corresponding to one period of the lighting pattern signal becomes less than 45%.

FIG. 9, in (2), shows an output waveform of the PD when a smallest current value Iv' is selected by the current value selecting unit 114. Then, the drive current Ik is overshot by an amount corresponding to a current value Iv' from a rise to the end of the second overshoot period Tov2. In this case as well, the integrated light amount ratio of the output waveform of the PD in the time period H corresponding to one period of the lighting pattern signal becomes less than 45%.

Next, FIG. 9 in (3) shows an output waveform of a PD when a current value Iv larger than the current value Iv' is selected by the current value selecting unit 114. Then, the drive current Ik is overshot by an amount corresponding to a current value Iv' from a rise to the second overshoot period Tov2. In this case, an integrated light amount ratio of the output waveform of the PD in a time period H corresponding to one period of the lighting pattern signal becomes between 50% to 55%. Therefore, the Iov2 value setting unit 113 sets the current value Iv as a value of the second overshoot current Ion2.

As described above, according to the present embodiment, the value of the first overshoot current Iov1 and the first overshoot period Tov1, which are stored in advance in the memory 120, are used without changing them even when a predetermined light amount Po to be targeted and a predetermined current Iop change. As for the value of the second overshoot current Iov1, it is adjusted and used every time an amount of light emitted from the light source changes. Thus, according to the present embodiment, the first overshoot current Iov1 may be set only once, so that a value may be adjusted only for the second overshoot current Iov2. Therefore, the present embodiment makes it possible to reduce an adjustment time and to reduce the circuit scale.

Figure 10:
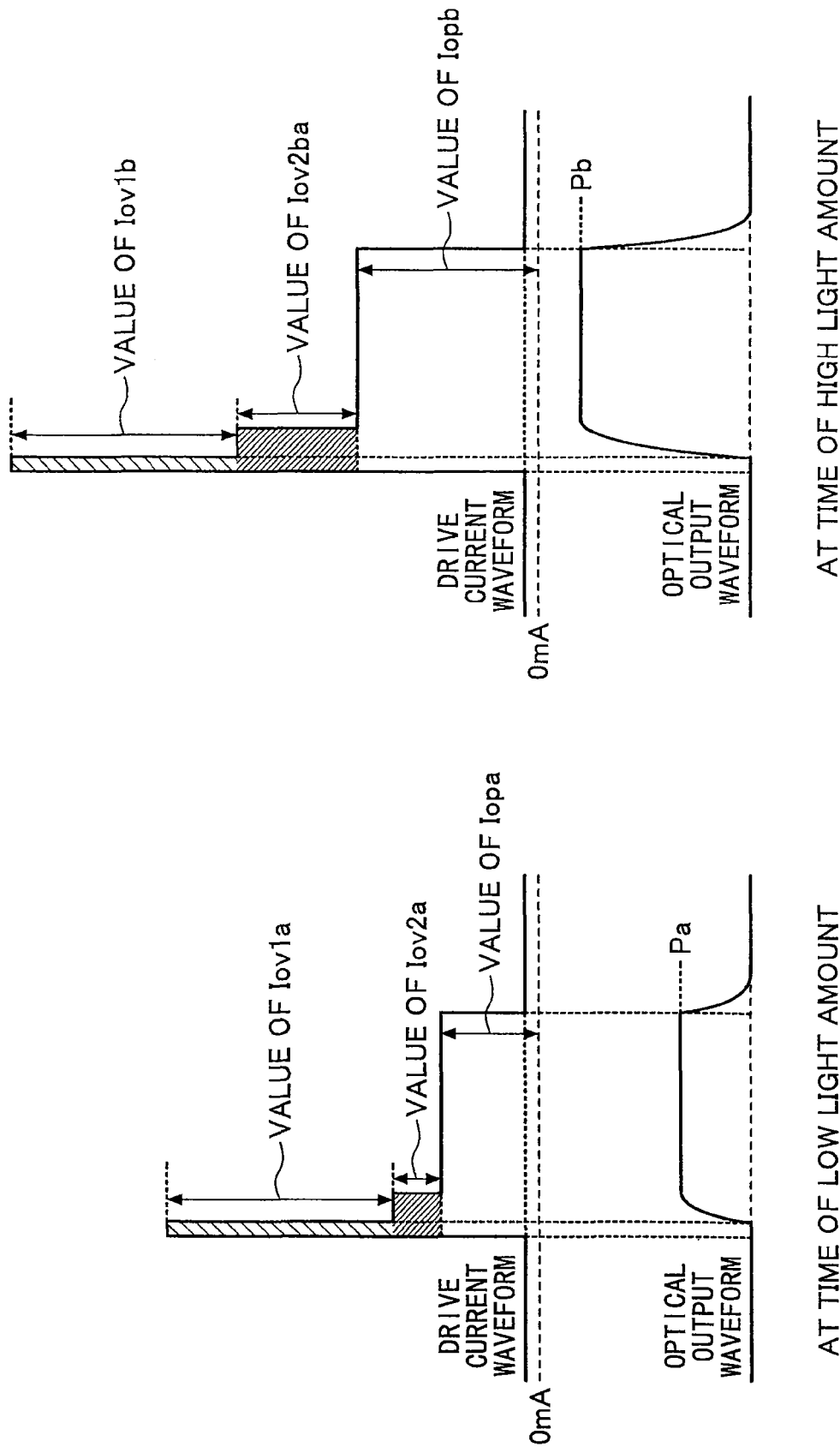
FIGS. 10A and 10B are diagrams illustrating an example of a drive current waveform and an optical output waveform when a light amount of the light source changes.

FIGS. 10A and 10B are diagrams illustrating an example of a drive current waveform and an optical output waveform when a light amount of the light source changes. FIG. 10A shows the drive current waveform and the optical output waveform at a time of a low light amount (Pa), while FIG. 10B shows a drive current waveform and an optical output waveform at a time of a high light amount (Pb). Moreover, the relative magnitude of a value of a predetermined current Iopa in FIG. 10A and a value of a predetermined current Iopb in FIG. 10B becomes such that Iopa<Iopb. This is because a light amount changes in accordance with a magnitude of the value of the predetermined current Iop.

Focusing on the second overshoot current Iov2 in FIGS. 10A and 10B, it is seen that the current amount changes with a change in the light amount. The current amount is determined by multiplying a value of the second overshoot current Iov2 and the second overshoot time Tov2.

In the examples in FIGS. 10A and 10B, a value of the second overshoot current Iov2 increases with an increase in the light amount. Thus, the relative magnitude of the value of the second overshoot current Iov2a in FIG. 10A and the value of the second overshoot current Iov2b in FIG. 10B becomes such that Iov2a<Iov2b. On the other hand, the value of the first overshoot current Iov1 is primarily determined based on the whole system such as a wiring of a board, a packaging of a light source, etc., so that the current value does not change even when the magnitude of the predetermined light amount Po and the magnitude of the predetermined current Iop are changed, yielding a relationship of Iov1a=Iov1b. In this way, the present embodiment makes it possible to obtain a stable optical output waveform with a simple setting of adjusting only a value of the second overshoot current Iov2 when the light amount is changed.

While the second overshoot period Tov2 is set to be a fixed value which corresponds to a delay time t2 stored in the memory in the present embodiment, a value of the delay time t2 may be changed to change the second overshoot period Tov2.

Figure 11:
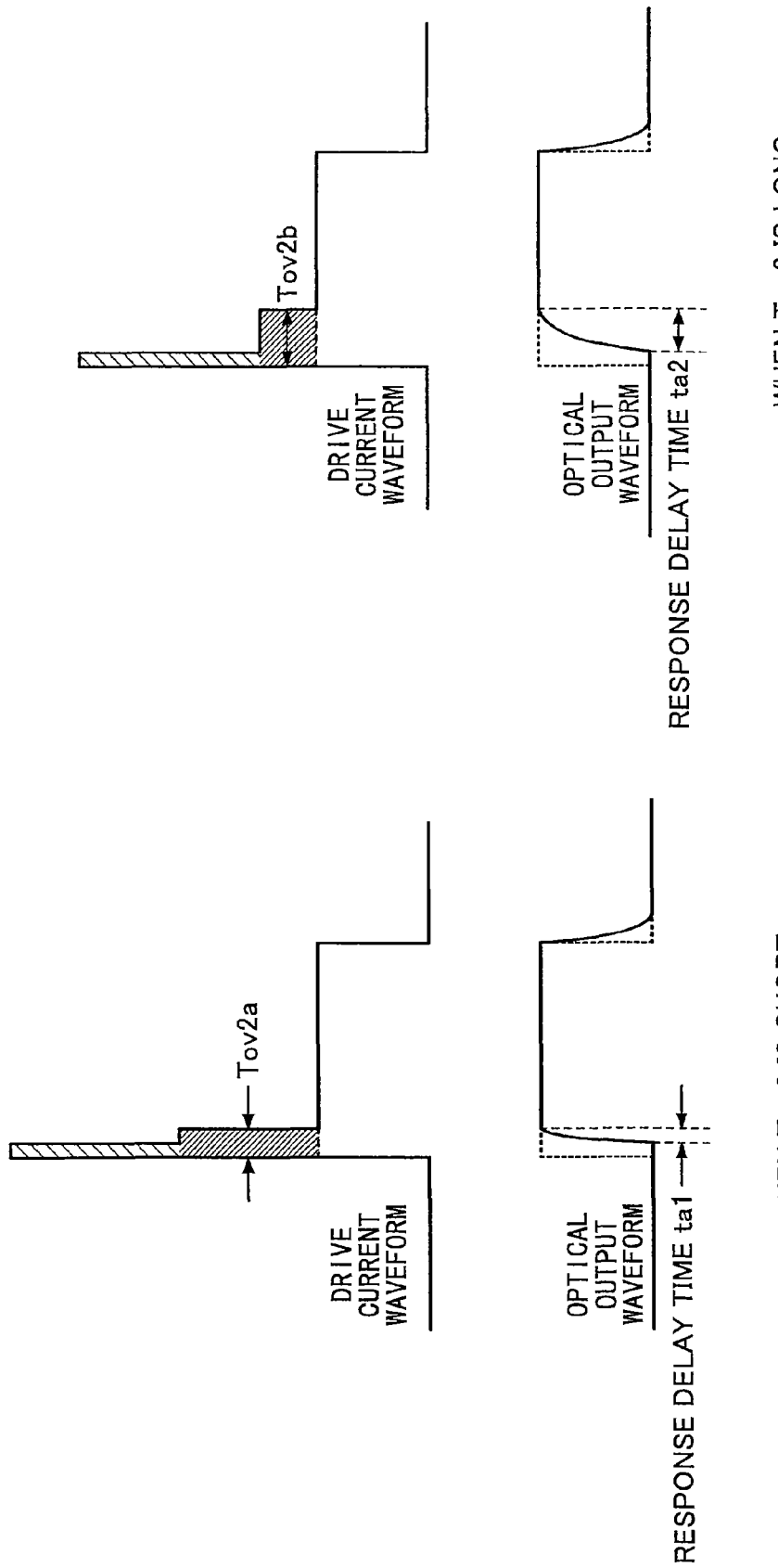
FIGS. 11A and 11B are diagrams illustrating an example of the drive current waveform and the optical output waveform when a second overshoot period Tov2 is changed.

FIGS. 11A and 11B are diagrams illustrating examples of the drive current waveform and the optical output waveform when the second overshoot period Tov2 is changed. FIG. 11A shows a case in which the second overshoot period Tov2 is short, while FIG. 11B shows a case in which the second overshoot period Tov2 is long.

Comparing optical output waveforms in FIGS. 11A and 11B, the response delay time ta2 in FIG. 11A is shorter than the response delay time ta1 in FIG. 11B (ta1<ta2), an optical output waveform in FIG. 11A has a shorter rise time, so that it rises more steeply. In other words, according to the present embodiment, the second overshoot period Tov2 may be set longer to increase dullness in a rise of the optical output waveform and it may be set shorter to decrease the dullness in the rise thereof. In this way, the present embodiment makes it possible to adjust a response delay time ta of an optical output waveform with the second overshoot period Tov2 and makes it possible to set an arbitrary response delay time ta in accordance with a usage condition, environment, etc., of the image forming apparatus 10.

Next, setting of the value of the first overshoot current Iov1 and the first overshoot period Tov1 according to the present embodiment is explained. According to the present embodiment, the value of the first overshoot current Iov1 and the first overshoot period Tov1 are fixed values to be preset.

The value of the first overshoot current Iov1 and the first overshoot period Tov1 according to the present embodiment may be calculated by an evaluation apparatus, etc., which are connected to the light source drive circuit 100 in a manufacturing process of the image forming apparatus 10, for example, and the calculated value may be stored in the memory 120.

Below, calculation of the value of the first overshoot current Iov1 and the first overshoot period Tov1 by the evaluation apparatus connected to the light source drive circuit 100 is explained.

Figure 12:
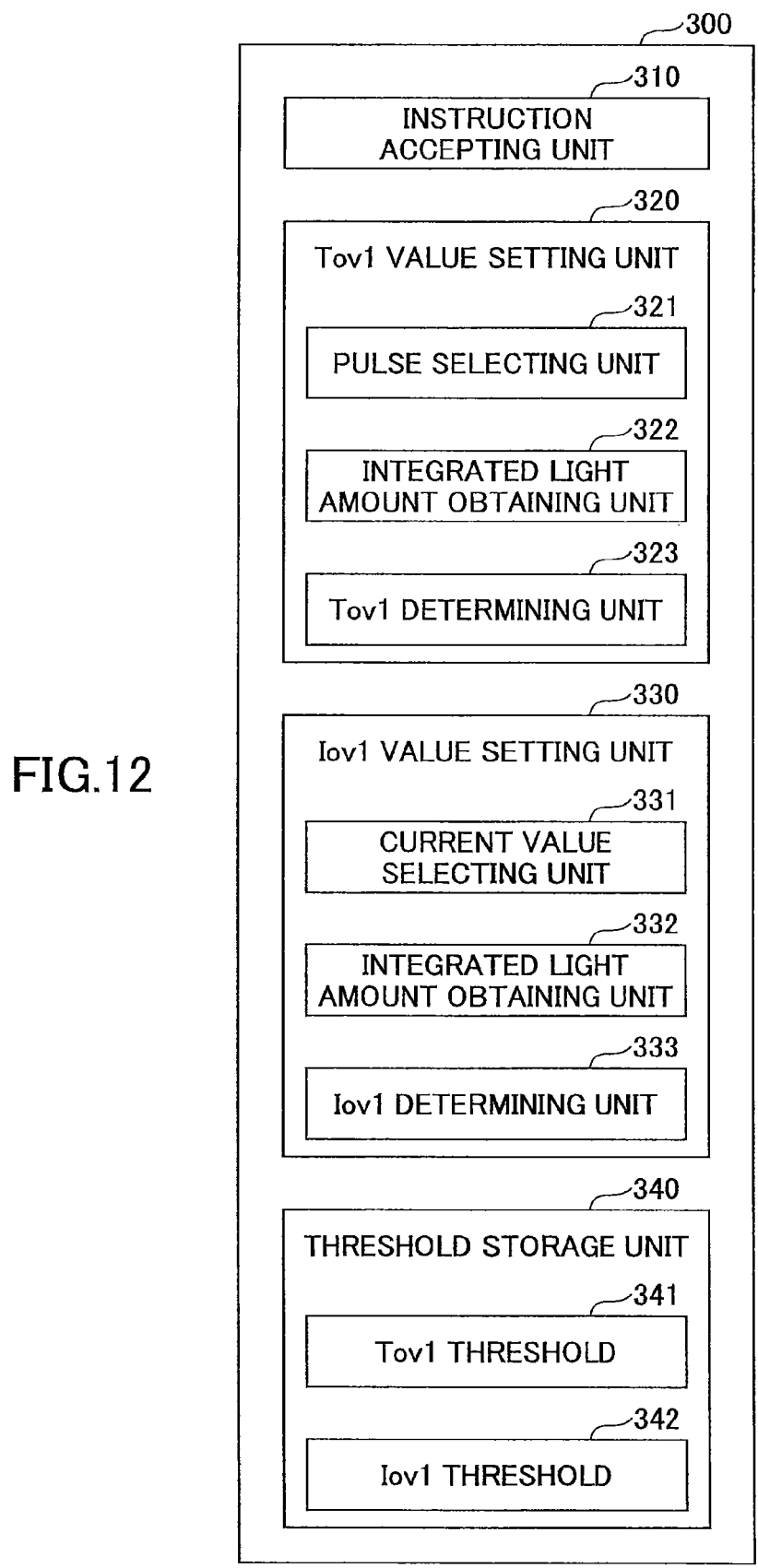
FIG. 12 is a diagram illustrating an example of a functional configuration of an evaluation apparatus connected to the light source drive circuit.

FIG. 12 is a diagram illustrating an example of a functional configuration of the evaluation apparatus connected to the light source drive circuit. According to the present embodiment, the evaluation apparatus 300 may be connected between the output side of the ADC 150 and the input side of the CPU 110, for example.

The evaluation apparatus 300 is a computer which includes an arithmetic processing unit and a storage unit, for example. The evaluation apparatus 300 includes an instruction accepting unit 310, a Tov1 value setting unit 320, an Iov1 value setting unit 330, and a threshold storage unit 340.

The instruction accepting unit 310 accepts setting instructions for the first overshoot period Tov1 and the first overshoot current Iov1. According to the present embodiment, it may be assumed that, for example, the evaluation apparatus 300 has accepted the setting instructions when it is connected to the light source drive circuit 100. Moreover, when the setting instructions are input by an evaluator who uses the evaluation apparatus 300, for example, the evaluation apparatus 300 may accept it.

The Tov1 value setting unit 320, which includes a pulse selecting unit 321, an integrated light amount obtaining unit 322, and a Tov1 determining unit 323, calculates and sets the first overshoot period Tov1.

The Iov1 value setting unit 330, which includes a current value selecting unit 331, an integrated light amount obtaining unit 332, and an Iov1 determining unit 333, calculates and sets a value of the first overshoot current Iov1.

In the threshold storage unit 340 are stored a Tov1 threshold 341 which is used in the Tov1 value setting unit 320 and an Iov1 threshold 342 which is used in the Iov1 value setting unit 330.

The Tov1 threshold 341 is a threshold for determining whether light emission of the LD has been detected. The Iov1 threshold 342 is a threshold for determining whether a light amount of the LD has reached a predetermined light amount. Details of processes of the Tov1 value setting unit 320 and the Iov1 value setting unit 330 will be described below.

Figure 13:
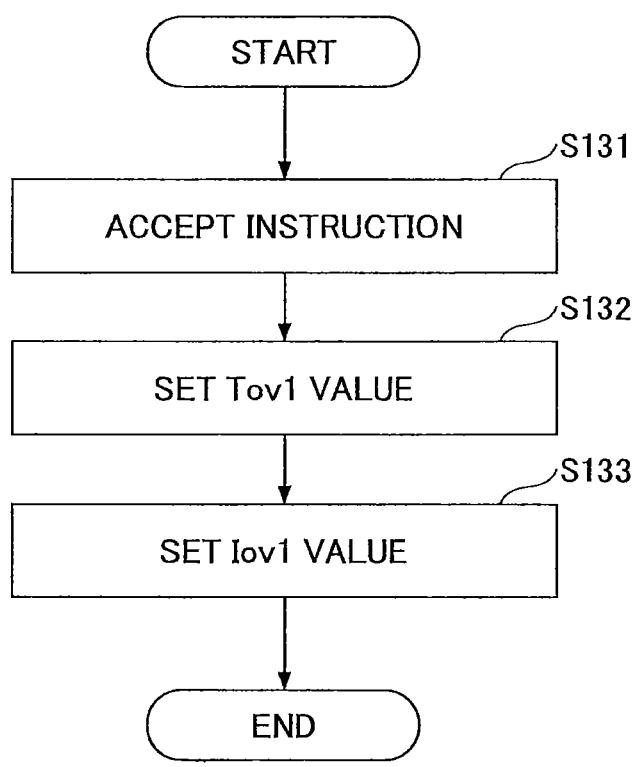
FIG. 13 is a flowchart for explaining setting of values of a first overshoot period Tov1 and a first overshoot current Iov1 by the evaluation apparatus.

Below, setting of the value of the first overshoot current Iov1 and the first overshoot period Tov1 by the evaluation apparatus 300 according to the present embodiment is explained with reference to FIG. 13. FIG. 13 is a flowchart for explaining setting of the value of the first overshoot current Iov1 and the first overshoot period Tov1 by the evaluation apparatus.

When setting instructions are accepted by the instruction accepting unit 310 (step S131), first the first overshoot period Tov1 is set by the Tov1 value setting unit 320 (step S132). Then, the evaluation apparatus 300 sets a value of the first overshoot current Iov1 by the Iov1 value setting unit 330 (step S133).

In this way, in the present embodiment, first the first overshoot period Tov1 is set and then the value of the first overshoot current Iov1 is set.

Figure 14:
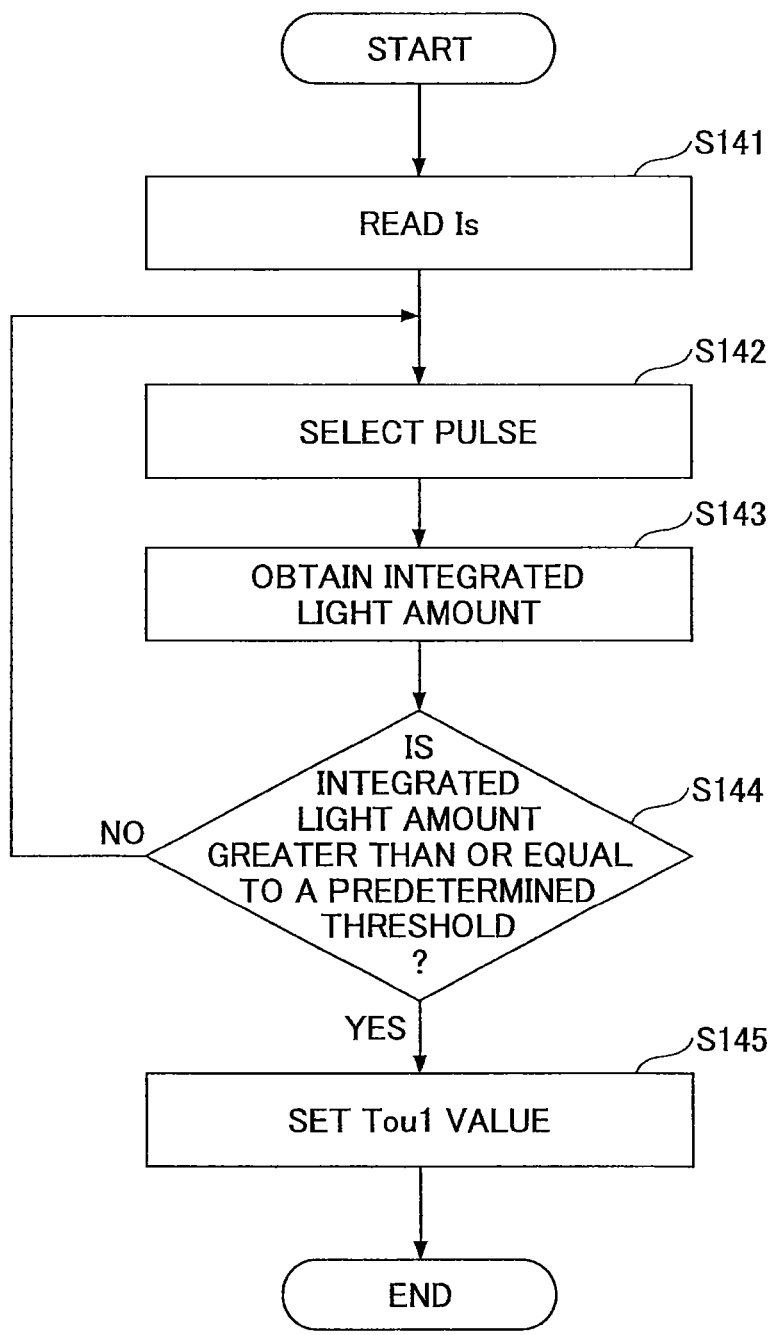
FIG. 14 is a flowchart for explaining a process of a Tov1 value setting unit in the evaluation apparatus.

Next, setting of the first overshoot period Tov1 according to the Tov1 value setting unit 320 is explained with reference to FIG. 14. FIG. 14 is a flowchart for explaining a process of a Tov1 value setting unit in the evaluation apparatus.

According to the present embodiment, a time from when supplying to the LD of a current larger than the predetermined current Iop is started to when light emission of the LD is detected is set as the first overshoot period Tov1.

According to the present embodiment, it is preferable to set the first overshoot period Tov1 to a shorter period. The first overshoot period Tov1 may be shortened to make it possible to charge a parasitic capacitance C in a short time and to reduce a parasitic delay time.

According to the present embodiment, a current larger than the predetermined current Iop supplied to the LD when the first overshoot period Tov1 is set is called a "Tov1 setting current" Is. The Tov1 setting current Is is stored within a storage apparatus (not shown) included by the evaluation apparatus 300, for example. Moreover, the Tov1 setting current Is may be stored in the memory 120 of the light source drive circuit 100, for example.

When the instruction accepting unit 310 in the evaluation apparatus 300 according to the present embodiment accepts setting instructions, the Tov1 value setting unit 320 reads a Tov1 setting current Is (Step S141). Next, the evaluation apparatus 300 causes the Tov1 setting current Is to be output to the first overshoot current source 230 via the CPU 110 and the DAC 130 (step S142). Then, the bias current Ib and the switching current Ih are turned off, so that a current supplied to the LD is to be only a Tov1 setting current Is which is output from the first overshoot current source 230.

Next, the Tov1 value setting unit 320 outputs an instruction signal for selecting a pulse signal to the CPU 110 by the pulse selecting unit 321 (step S143). Then, the pulse selecting unit 321 causes selection of a pulse signal in an ascending order of a pulse width of the pulse signal to the CPU 110 in order to determine whether light emission of the LD has been detected.

When the pulse signal is selected in the CPU 110, the pulse signal selected is supplied to the switch 231 as the first overshoot generating signal via the LD driver 200. The switch 231 according to the present embodiment is to be turned on during a period in which the first overshoot generating signal is supplied. Therefore, when the switch 231 is turned on, the Tov1 setting current is supplied to the LD.

Next, the integrated light amount obtaining unit 322 obtains, as a digital value via the ADC 150, an integrated light amount obtained by integrating a waveform of an electrical signal output from the PD based on a light amount of the LD by the LPF 140 (step S143).

Next, the Tov1 determining unit 323 refers to the Tov1 threshold 341 stored in the threshold storage unit 340 and determines whether the integrated light amount is greater than or equal to the Tov1 threshold (step S144). In step S144, when the integrated light amount is greater than or equal to the Tov1 threshold, the Tov1 determining unit 323 determines that light emission of the LD has been detected, and sets a pulse width of a pulse signal selected just one previous to the pulse signal selected in step 5142 is set as the first overshoot period Tov1. Here, the Tov1 determining unit 323 saves the first overshoot period Tov1 in the memory 120 via the CPU 110 (step S145).

When the integrated light amount is less than the Tov1 threshold in step S144, the Tov1 value setting unit 320 returns to step S142 and selects the next narrowest pulse signal.

Below, with reference to FIGS. 15A to 15D, the first overshoot period Tov1 is further explained. FIGS. 15A to 15D are diagrams for explaining the first overshoot period Tov1. FIGS. 15A to 15D show output waveforms of the PD when the Tov1 setting current Is is provided to the light source in synchronization with pulse signals with different pulse widths.

FIGS. 15A to 15D show output waveforms of the PD when pulse signals are selected in an ascending order of the pulse width thereof. The electrical signal output from the PD is converted to a voltage value by a resistor R1 so as to be supplied to the LPF 140.

Figure 15:
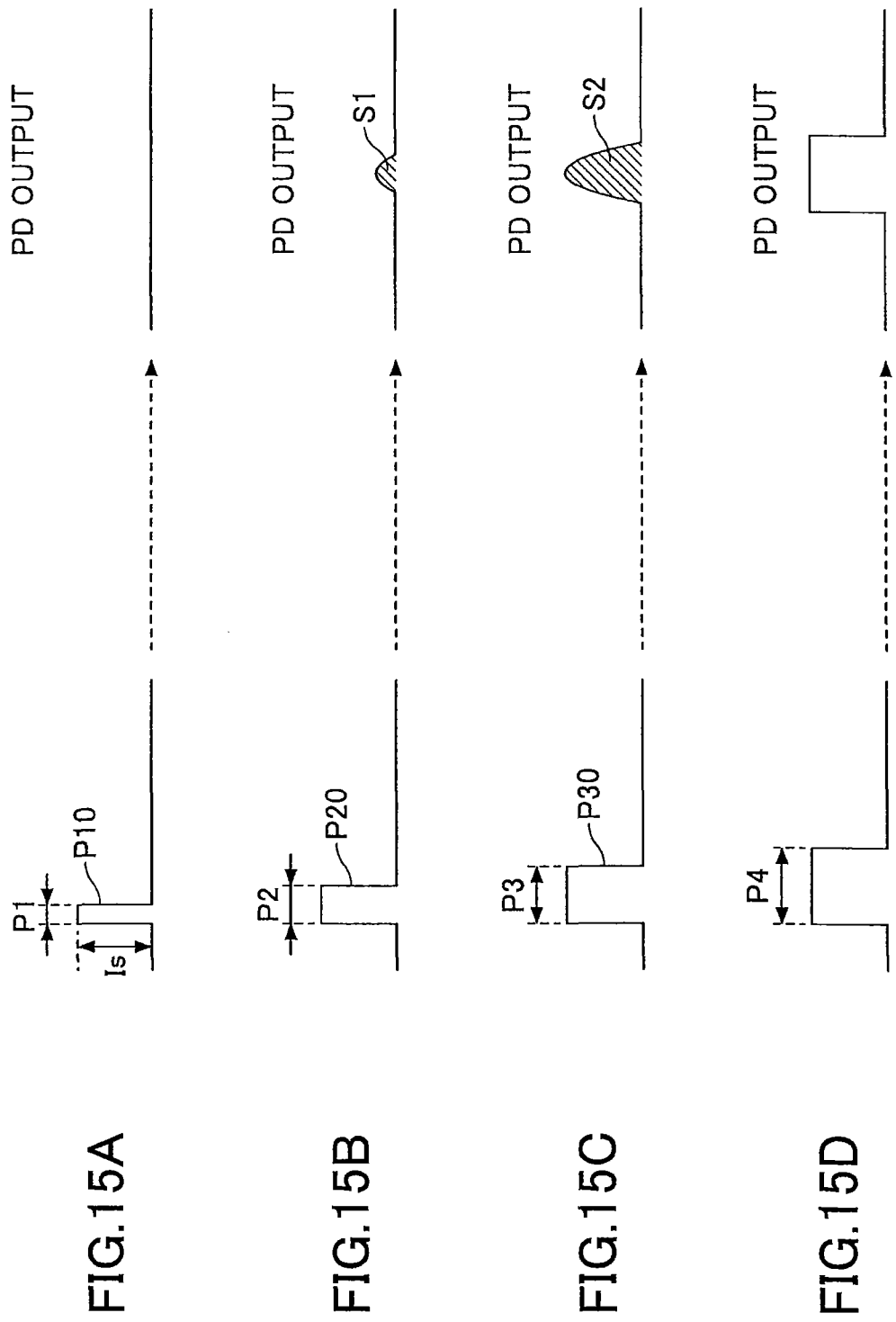
FIGS. 15A to 15D are diagrams for explaining the first overshoot period Tov1.

FIG. 15A shows an output waveform of the PD when a pulse signal P10 which is first selected in the CPU 110 is supplied to the LD. The pulse signal P10 is a signal with a narrowest pulse width out of pulse signals which can be selected by the CPU 110 and the pulse width is set to be P1. Then, an output of the PD is not manifested, so that the integrated light amount is 0. Therefore, it is seen that no light emission occurs in the LD.

FIG. 15B shows an output waveform of the PD when a pulse signal P20 with a pulse width P2 is selected. Then, an output of the PD is slightly manifested, so that the integrated light amount is S1.

FIG. 15C shows an output waveform of the PD when a pulse signal P30 with a pulse width P3 is selected. Then, an output of the PD is slightly manifested, so that the integrated light amount is S2.

According to the present embodiment, it is assumed that light emission of the LD is detected when the pulse width of the pulse signal is gradually increased in this way, so that the integrated light amount of the output waveform of the PD becomes greater than or equal to a Tov1 threshold.

The Tov1 threshold is a proportion of an integrated light amount of an output waveform of the PD corresponding to light emission of the LD by the pulse signal relative to the integrated light amount (below-called the "total integrated light amount") of the output waveform of the PD when the LD outputs a predetermined light amount Po. According to the present embodiment, the Tov threshold may be set to around a few % of the total integrated light amount. According to the present embodiment, the Tov1 threshold is set to 5%, for example. In this case, when the integrated light amount of the output waveform of the PD reaches at least 5% of the total integrated light amount, it is determined that light emission occurs in the LD.

In FIG. 15A to 15D, assuming that the integrated light amount S1 is around 3% of the total integrated light amount; and the integrated light amount S2 is around 10% of the total integrated light amount, the Tov1 value setting unit 320 sets the pulse width P2 to the first overshoot period Tov1.

Now, a Tov1 setting current Is which is supplied to the LD when setting the first overshoot period Tov1 is explained with reference to FIG. 16.

Figure 16:
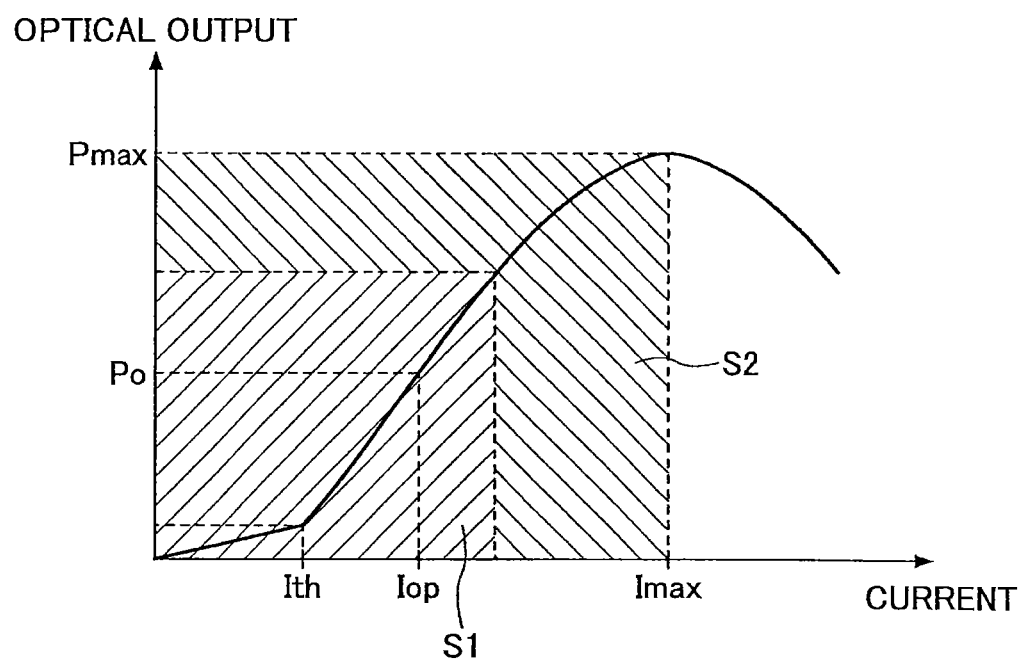
FIG. 16 is a diagram illustrating a current-optical output characteristic of an LD.

FIG. 16 is a diagram illustrating a current-optical output characteristic of the LD. In FIG. 16, a region S1 is a linear region in the current-optical output characteristic, while a region S2 is a non-linear region in the current-optical output characteristic.

A value of the Tov1 setting current Is according to the present embodiment may be a value which is larger than a predetermined current Top within the linear region S1 shown in FIG. 16 and less than or equal to a current Imax which corresponds to a maximum optical output Pmax in the non-linear region S2.

It is preferable in the present embodiment that light emission of the LD may be detected in a shorter time the larger the Tov1 setting current Is in the above-mentioned range and the first overshoot period Tov1 may be set in a short time. Thus, for example, in the present embodiment, the Tov1 setting current Is may be set to be the current Imax. More specifically, for example, in the present embodiment, a value of the Tov1 setting current Is may be determined such that the first overshoot period Tov1 becomes around 1 nano second.

In this way, according to the present embodiment, a current which is larger than a predetermined current Iop for obtaining a predetermined light amount Po which is set as a target light amount from the LD when setting the first overshoot period Tov1 is supplied to the LD, causing light emission of the LD to be detected in a short time. According to the present embodiment, even when a value of the Tov1 setting current Is is set to be a value exceeding a rated current of the LD, the Tov1 setting current Is is supplied to the LD during a period over which the LD does not break down.

Next, setting of the first overshoot current Iov1 by the Iov1 value setting unit 330 of the evaluation apparatus 300 is explained with reference to FIG. 17. FIG. 17 is a flowchart for explaining a process of the Iov1 value setting unit in the evaluation apparatus.

In the evaluation apparatus 300 of the present embodiment, when the instruction accepting unit 310 accepts a setting instruction (step S1701), the Iov1 value setting unit 330 reads the predetermined current Iop (step S1702). The Iov1 value setting unit 330 reads a lighting pattern signal from the memory 120 via the CPU 110 (step S1703). Next, the Iov1 value setting unit 330 reads the first overshoot period Tov1 (step S1704).

When the first overshoot period Tov1 is read, the Iov1 value setting unit 330 outputs a current value selecting signal for selecting a current value by the current value selecting unit 331 to the DAC 130 via the CPU 110 (step S1705). The current value selecting unit 331 selects a current value in an ascending order of the value thereof out of current values which can be output in the DAC 130.

When the current value selecting signal is received via the CPU 110, the DAC 130 converts the selected current value to an analog value to output the analog value to the first overshoot current source 230. The first overshoot current source 230 supplies the selected current value to the LD. Here, the pulse generating unit 112 supplies a first overshoot generating signal which is synchronized with a rise of the lighting pattern signal to the switch 231. The first overshoot generating signal turns on the switch 231 only for the first overshoot period Tov1 read in step S1704.

Next, the Iov1 value setting unit 330 obtains, by the integrated light amount obtaining unit 332, an integrated light amount of an output waveform of the PD that is output from the ADC 150 (step S1706). Next, the Iov1 value setting unit 330, by the Iov1 determining unit 333, refers to the threshold storage unit 340 and determines whether the obtained integrated light amount is greater than or equal to the Iov1 threshold (step S1707).

In step S1707, when the integrated light amount is greater than or equal to the Iov1 threshold, the Iov1 value setting unit 330 sets the current value selected then to be a value of the second overshoot current Iov2 and saves the set current value in the memory 120 via the CPU 110 (step S1708). In step S1707, when the integrated light amount is not greater than or equal to the Iov1 threshold, the Iov1 value setting unit 330 returns to step S1705, and selects the next largest current value.

As described above, according to the present embodiment, the evaluation apparatus 300 which is connected to the light source drive circuit 100 sets the first overshoot period Tov1 and a value of the first overshoot current Iov1 as fixed values to the light source drive circuit 100.

While the evaluation apparatus 300 is arranged to be connected to the outside of the light source drive circuit 100, it is not limited thereto. For example, in the light source drive circuit 100 according to the present embodiment, the CPU 110 may include functions included in the evaluation apparatus 300, for example. In this case, the light source drive circuit 100 may save the first overshoot period Tov1 and the value of the first overshoot current Iov1 in the memory 120 without using the evaluation apparatus 300.

FIGS. 18A to 18C are first diagrams for explaining advantageous effects of the first embodiment.

FIG. 18A shows a drive current waveform and an optical output waveform when only a predetermined current Iop is applied to the LD. FIG. 18B shows a drive current waveform and an optical output waveform when the predetermined current Iop and the first overshoot current Iov1 are applied to the LD. FIG. 18C shows a drive current waveform and an optical output waveform according to the present embodiment.

In FIG. 18A, the drive current waveform is a rectangular wave, while there is dullness in a rise of the optical output waveform. Moreover, in FIG. 18A, a light emission delay time T1 from when supplying of the drive current to the light source is started to when the light source outputs a predetermined light amount Po occurs.

In FIG. 18B, the first overshoot current Iov1 which is applied in synchronization with the predetermined current Iop charges a parasitic capacitance in advance, so that the light emission delay time T2 of the optical output waveform is shorter than the light emission delay time T1. However, for the rise of the optical output waveform, there is dullness which is equivalent to that as in FIG. 18A.

In the drive current waveform of the present embodiment shown in FIG. 18C, the first overshoot current Iov1 and the second overshoot current Iov2 are applied in synchronization with the predetermined current Iop. According to the present embodiment, the parasitic capacitance is charged by the first overshoot current Iov1 and dullness in the rise of the optical output waveform is improved by the second overshoot current Iov2. Thus, the present embodiment makes it possible to obtain an optical output waveform which is close to a rectangular wave. Moreover, it is seen that the light emission delay time T3 is shorter than the light emission delay times T1 and T2.

Figures 19A, 19B:
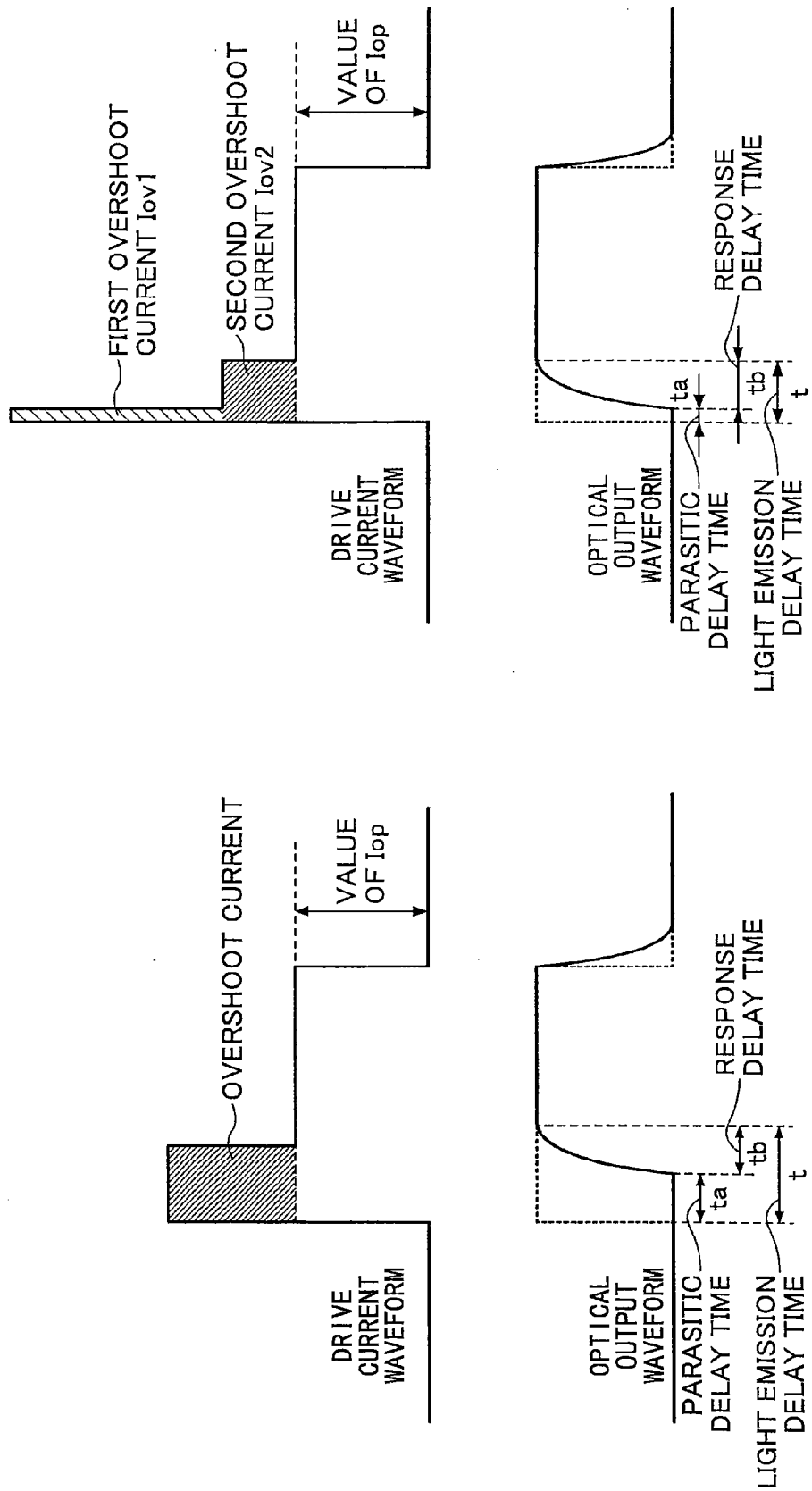
FIGS. 19A and 19B are second diagrams for explaining the advantageous effect of the first embodiment.

FIGS. 19A and 19B are second diagrams for explaining the advantageous effects of the first embodiment.

FIG. 19A is a diagram showing a waveform of a drive current including a overshoot current in a related art and a corresponding optical output waveform. FIG. 19B is a diagram showing a drive current waveform and an optical output waveform according to the present embodiment.

Compared to the optical output waveform shown in FIG. 18A, the optical output waveform shown in FIG. 19A has dullness in the rise thereof reduced, so that the response delay time tb is shortened. However, in the optical output waveform shown in FIG. 19A, there remains a large parasitic delay time ta. Thus, an optical output waveform pulse is narrowed, making it not possible to compensate for a light amount.

On the other hand, as shown in FIG. 19B, according to the present embodiment, the parasitic capacitance may be charged at high speed by the first overshoot current Iov1 to shorten the parasitic delay time ta. Moreover, according to the present embodiment, the response delay time tb may also be reduced due to an effect of the second overshoot current Iov2. Thus, the present embodiment makes it possible to reduce the final light emission delay time t and compensate for the required light amount.

Now, in the related art, an LD with a large package, in particular, has various varying factors for the response characteristics such as a resistance component increasing depending on a wavelength band or an increase in the parasitic capacitance. For example, compared to a 780 nm band infrared semiconductor laser in a wavelength, a 650 nm band red light semiconductor laser generally has a large differential resistance; thus, it is not always the case that an optical output response is obtained at high speed, so that dullness of the waveform may occur. Moreover, even with the infrared semiconductor laser, a VCSEL (vertical cavity surface emitting laser), etc., has a differential resistance of around a few hundred Qs due to a structural difference, which differential resistance is very large compared to that of an edge type laser. Thus, a CR time constant results from a terminal capacitance of a VCSEL itself; a parasitic capacitance of a substrate having mounted thereon the VCSEL; a terminal capacitance of a driver, etc., and a differential resistance of the VCSEL. Therefore, there is a problem that, even when the VCSEL itself has a cutoff frequency Ft or a device property of being able to modulate at high speed, when it is mounted on the substrate, the desired high-speed optical output response is not obtained, causing an increased light emission delay time.

The present embodiment corrects for an optical output waveform in accordance with a parasitic waveform, a differential resistance, etc., regardless of a type of light source, making it possible to reduce the light emission delay time and obtain the light output waveform close to a current waveform of the predetermined current Iop. In other words, according to the present embodiment, even when there are multiple light sources such as the VCSEL and the light sources have a large differential resistance, the first overshoot current Iov1 and the second overshoot current Iov2 that are optimum for each light source may be set. Thus, the present embodiment makes it possible to reduce light emission variations among the light sources and to reduce color drift and density variations of images in the image forming apparatus 10, for example. Moreover, according to the present embodiment, the second overshoot current Iov2 is adjusted in accordance with a light amount and a magnitude of the predetermined current Iop, making it possible to obtain a desired optical output waveform even when the light amount of the light source is changed.

In this way, the present embodiment makes it possible to reduce a light emission delay time of an optical output and to improve a response characteristic.

(Second Embodiment)

Below a second embodiment of the present invention is explained with reference to the drawings. The second embodiment of the present invention is different from the first embodiment in that a bias current Ib is not included in the drive current Ik. Thus, in the explanation of the second embodiment below, only differences from the first embodiment are explained and the same letters/numerals used in the explanations of the first embodiment are given to those having the same functional configuration as the first embodiment, so that the explanations thereof are omitted.

Figure 20:
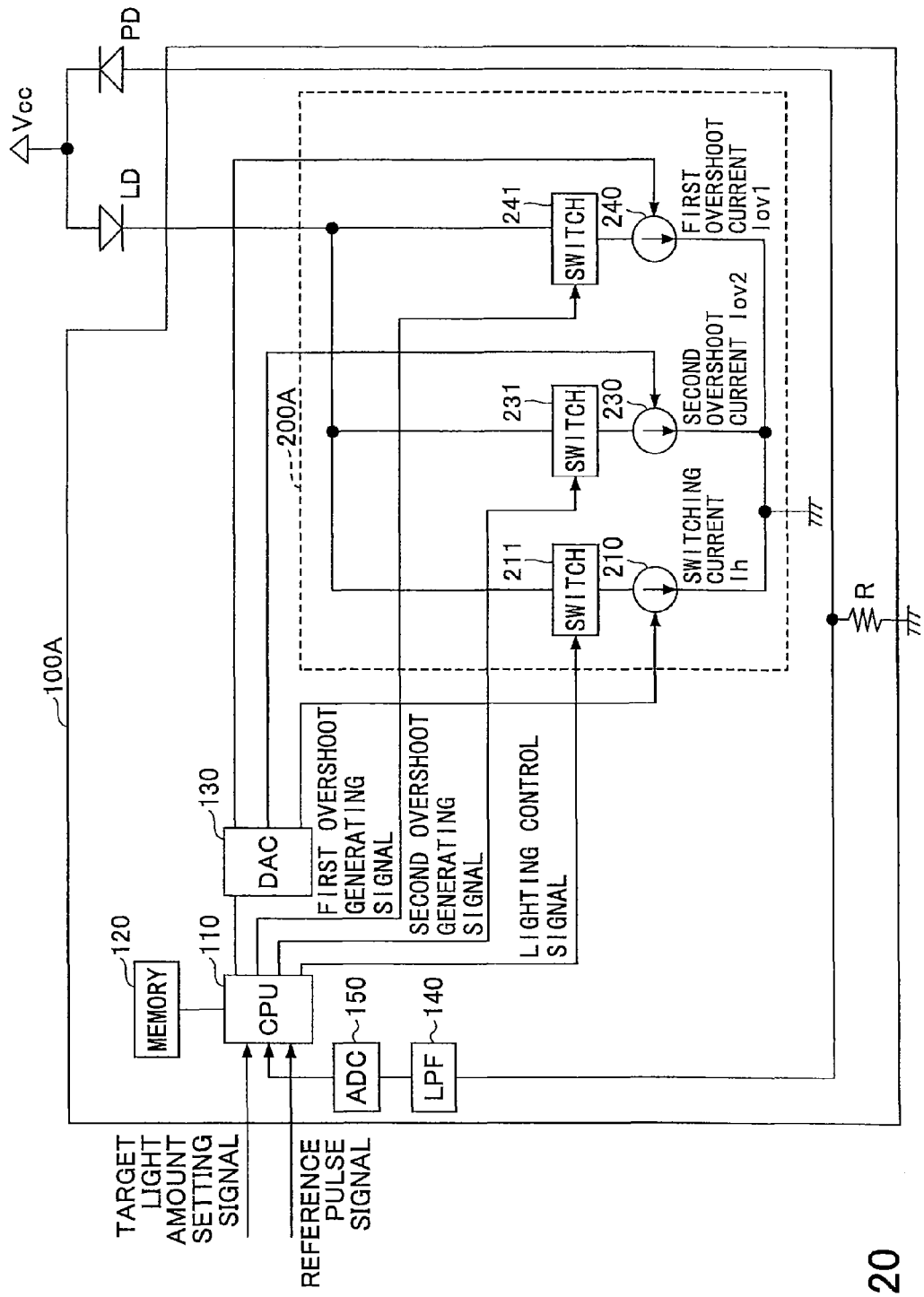
FIG. 20 is a diagram for explaining the light source drive circuit of a second embodiment.

FIG. 20 is a diagram for explaining a light source drive circuit according to the second embodiment. A light source drive circuit 100A according to the present embodiment has an LD driver 200A. The LD driver 200A includes a switching current source 210; a first overshoot current source 230; a second overshoot current source 240; and switches 211, 231, and 241. The LD driver 200A according to the present embodiment includes output currents from three current sources based on an analog value supplied from the DAC 130 and generates a drive current Ik. More specifically, the LD driver 200A according to the present embodiment generates the drive current Ik to which the first overshoot current Iov1 and the second overshoot current Iov2 are applied in synchronization with a rise of a switching current Ih and supplies the generated drive current Ik to the LD.

Figure 21:
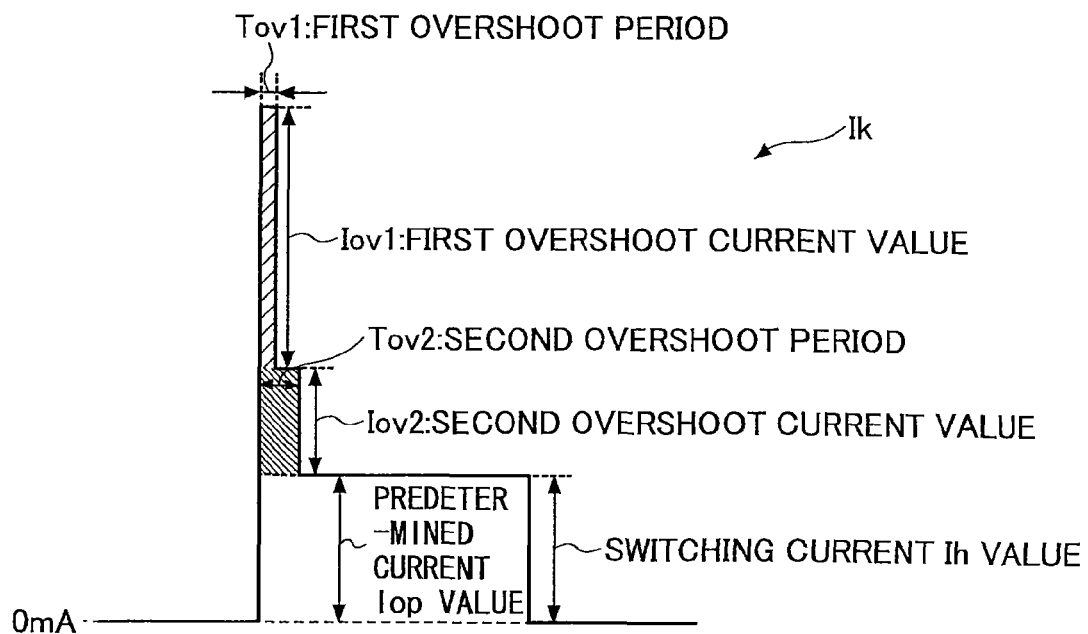
FIG. 21 is a diagram for explaining a drive current waveform of the second embodiment.

FIG. 21 is a diagram illustrating a drive current waveform according to the second embodiment.

In the drive current Ik according to the present embodiment, the bias current Ib is not used, so that a value of the switching current Ih and a value of the predetermined current Ip become equal.

(Third Embodiment)

With reference to the drawings, a third embodiment of the present invention is explained with reference to the drawings. The third embodiment of the present invention is different from the first embodiment in that the drive current Ik includes an undershoot current. Thus, for the third embodiment of the present invention, only differences from the first embodiment are explained and the same letters/numerals used in the explanations of the first embodiment are given to those having the same functional configuration as the first embodiment, so that the explanations thereof are omitted.

Figure 22:
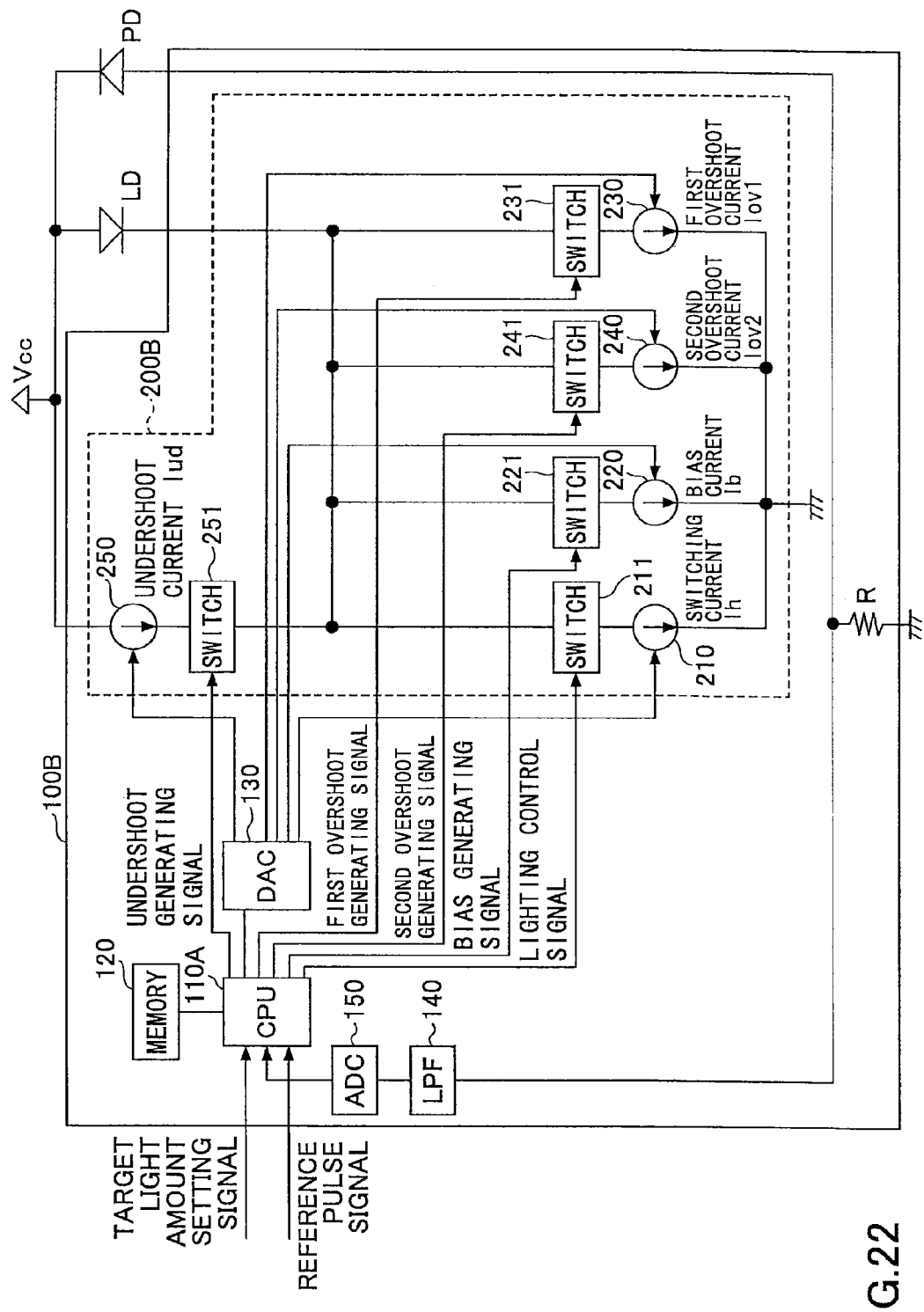
FIG. 22 is a diagram for explaining the light source drive circuit of a third embodiment.

FIG. 22 is a diagram for explaining a light source drive circuit according to the third embodiment.

A light source drive circuit 100B according to the present embodiment includes an LD driver 200B. The light source drive circuit 100B includes a CPU 110A and the LD driver 200B. The LD driver 200B includes a switching current source 210; a bias current source 220; a first overshoot current source 230; a second overshoot current source 240; an undershoot current source 250; and switches 211, 221, 231, 241, 251. A connection of the undershoot current source 250 with the LD is controlled by on/off of the switch 251. When the switch 251 is turned on, the undershoot current source 250 supplies an undershoot current Iud to the LD in synchronization with a fall of a switching current Ih.

On/off of the switch 251 is controlled by an undershoot generating signal supplied from the CPU 110. More specifically, the switch 251 is turned on during a period (below called an "undershoot period" Tud) in which the undershoot generating signal is at a high level.

Figure 23:
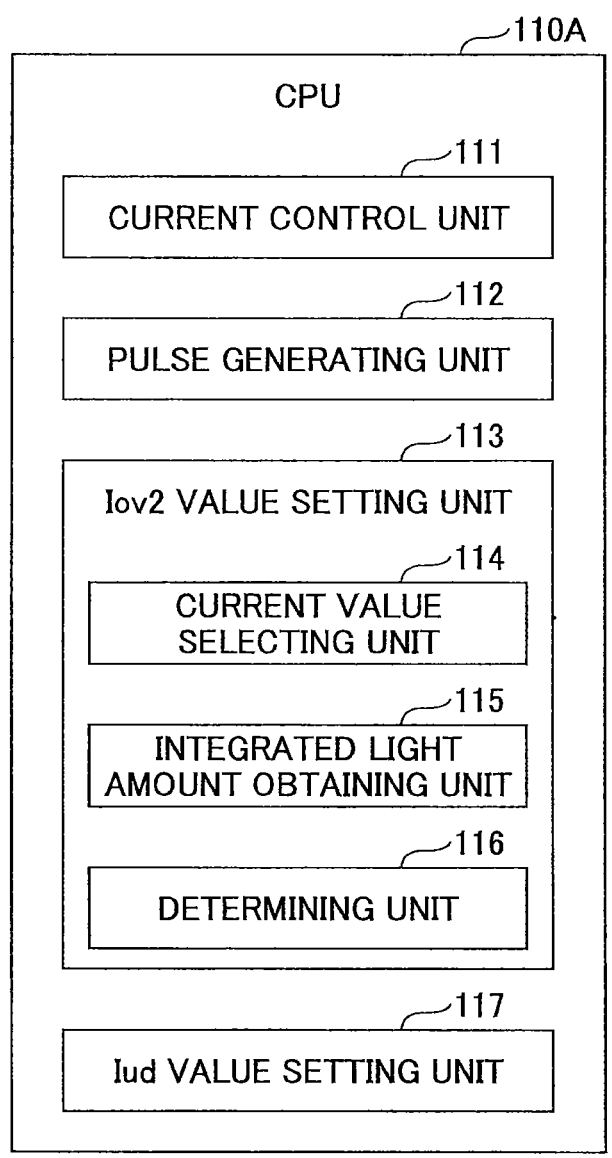
FIG. 23 is a diagram for explaining a functional configuration of the CPU of the third embodiment.

FIG. 23 is a diagram for explaining a functional configuration of a CPU according to the third embodiment. The CPU 110A according to the present embodiment includes an Iud value setting unit 117 in addition to the respective units included in the CPU 110 according to the first embodiment.

The Iud value setting unit 117 according to the present embodiment refers to the memory 120 and calculates a sum of a current amount of a first overshoot current Iov1 and a current amount of a second overshoot current Iov2. The current amount is defined by a current value x on time. More specifically, for example, the current amount of the first overshoot current Iov1 is a product of the value of the first overshoot current Iov1 and the second overshoot period Tov1. The current amount of the second overshoot current Iov2 is a product of the value of the second overshoot current Iov2 and the value of the second overshoot period Tov2.

Then, the Iud value setting unit 117 sets the value of the undershoot current Iud and the undershoot period Tud such that a sum of the two current amounts and the current amount of the undershoot current Iud become equal.

For the undershoot current Iud, roles are played of correcting for dullness in a fall of the optical output waveform and discharging of a parasitic capacitance charged by the first overshoot current Iov1, etc. Therefore, the current amount of the undershoot current needed for improving the optical output waveform becomes almost equal to the current amount of the second overshoot current Iov2 and the current amount of the undershoot current needed for discharging the parasitic capacitance becomes almost equal to the current amount of the first overshoot current Iov1.

Thus, according to the present embodiment, the current amount of the undershoot current Iud may be set such that it becomes equal to the sum of the two current amounts to further improve a response characteristic of the optical output waveform.

Moreover, according to the present embodiment, the undershoot current Iud is set using the first and the second overshoot currents Iov1 and Iov2, so that complex operations, etc., are not needed, making it possible to speedily set the undershoot current Iud. Moreover, according to the present embodiment, the undershoot period Tud may be set equal to the second overshoot period Tov2. In this case, a response at the time of a rise of the optical output waveform and a response at the time of a fall may be set to be almost equal.

Figure 24:
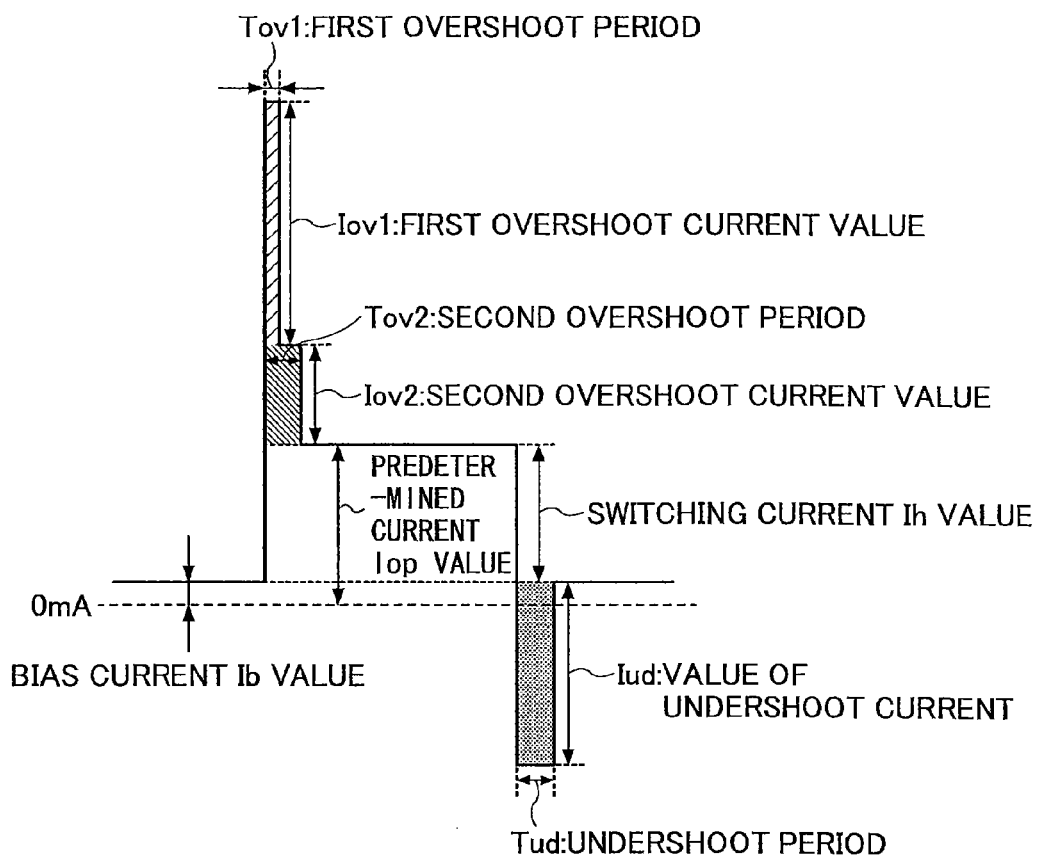
FIG. 24 is a diagram for explaining a drive current waveform of the third embodiment.

FIG. 24 is a diagram illustrating a drive current waveform according to the third embodiment.

In the drive current Ik according to the present embodiment, an undershoot current Iud is applied in synchronization with a fall of the predetermined current Iop according to the first embodiment. The undershoot current Iud may reduce dullness in the fall of the optical output waveform and further speedily discharge the parasitic capacitance charged.

Below embodiments of a semiconductor laser drive circuit and the image forming apparatus which includes the semiconductor drive circuit is described with reference to the drawings.
(Semiconductor Laser Drive Circuit)

Figure 25:
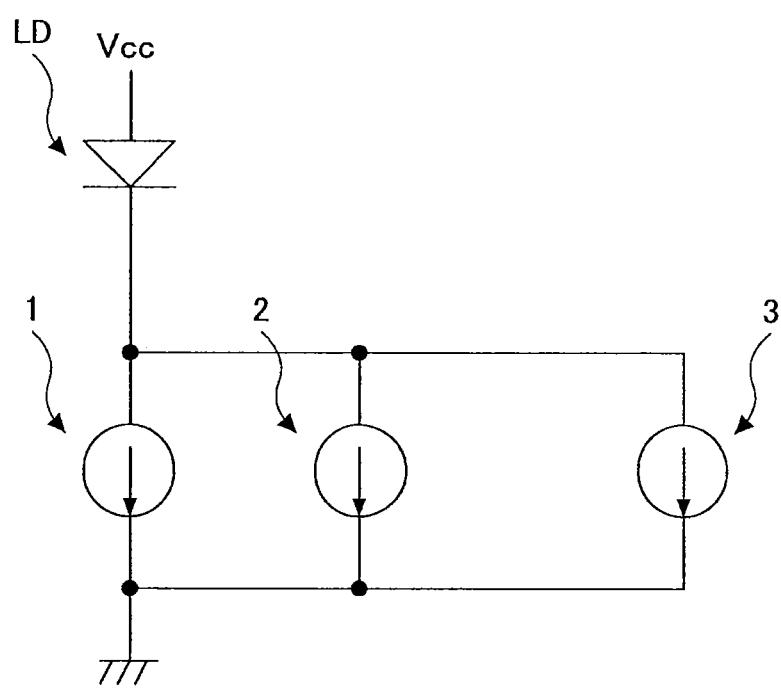
FIG. 25 is a conceptual diagram illustrating an embodiment of a semiconductor laser drive circuit according to the present invention.

First, embodiments of the semiconductor laser drive circuit according to the present invention are described.
Configuration of Semiconductor Laser Drive Circuit FIG. 25 is a conceptual diagram illustrating an embodiment of the semiconductor laser drive circuit according to the present invention.

The semiconductor laser drive circuit according to the present invention includes a light emission current generating unit 1; a first differential current generating unit 2; and a second differential current generating unit 3.

The light generation current generating unit 1 is a unit which steadily converts a light emission signal (voltage) at a time of lighting a semiconductor laser LD to generate a light emission current as a semiconductor laser drive current. The light generation current generating unit 1 corresponds to a current source according to the present invention.

The first differential current generating unit 2 is a unit which differentiates the light emission signal to generate a first overshoot current which is injected for a very short initial time (for example, 0.5 ns to 1.0 ns) in which the light emission generating unit 1 is started. The first differential current generating unit 2 corresponds to the first overshoot current source according to the present invention.

The second differential current generating unit 3 is a unit which differentiates a light emission signal with a differential value different from that in the first differential current generating unit 2 to generate a second overshoot current which is injected for a short initial time (for example, 1.0 ns to 5.0 ns) in which the light emission generating unit 1 is started. The second differential current generating unit 3 corresponds to the second overshoot current source according to the present invention. The second differential current generating unit 3 injects the second overshoot current with a time constant (an overshoot time and an overshoot amount) that is different from that for the first overshoot current.

Here, the semiconductor laser drive circuit drives the semiconductor laser LD by a sum current of three currents of the light emission current; the first overshoot current; and the second overshoot current that are generated in the above-described units for generating three types of currents. The above-described configuration makes it possible for the semiconductor laser drive circuit to properly and stably supply an integrated light amount which is most necessary for forming an image.

As the semiconductor laser LD, an infrared laser diode which emits an infrared light; various laser diodes or laser diode arrays that emit a red light, a blue light, etc., may be used, for example.
(Operation of the Semiconductor Laser Drive Circuit)

Next, an operation of the semiconductor laser drive circuit is described with reference to a semiconductor laser drive current waveform which is generated by the semiconductor laser drive circuit.

Figure 26:
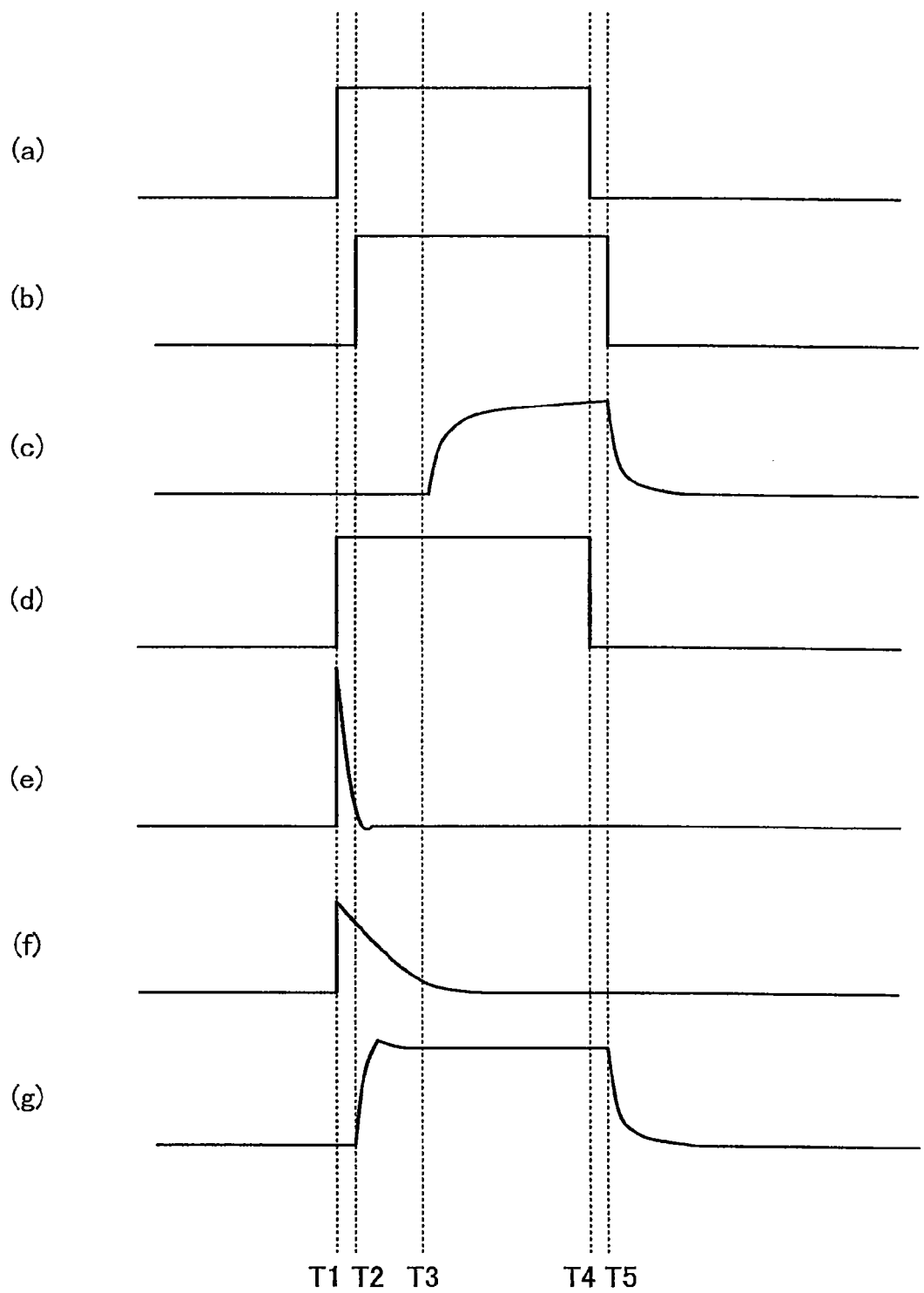
FIG. 26 is a diagram which compares a waveform diagram of a current generated by the above-mentioned semiconductor laser drive circuit with a waveform diagram of a current generated by a related art semiconductor laser drive circuit.

FIG. 26 is a diagram which compares a waveform diagram of a current generated by the semiconductor laser drive circuit according to the present invention with a waveform diagram of a current generated by a related art semiconductor laser drive circuit.

Here, (a) in FIG. 26 is a waveform diagram illustrating a light emission signal which causes the semiconductor laser LD to emit light, while (b) in FIG. 26 is a diagram for an ideal waveform which causes the semiconductor laser LD to emit light.

(c) in FIG. 26 is a waveform diagram of a drive current generated by the related art semiconductor laser drive circuit.

(d) in FIG. 26 is a waveform diagram of a modulation current which causes the semiconductor laser LD to emit light.

(e) in FIG. 26 is a waveform diagram of the first overshoot current generated by the first differential current generating unit 2.

(f) in FIG. 26 is a waveform diagram of the second overshoot current generated by the second differential current generating unit 3.

(g) in FIG. 26 is a waveform diagram of a drive current generated by the present circuit.

Next, a configuration of one example of a related art semiconductor laser drive circuit and an operation thereof are described in order to compare with the configuration of the present circuit and an operation thereof.

Figure 27:
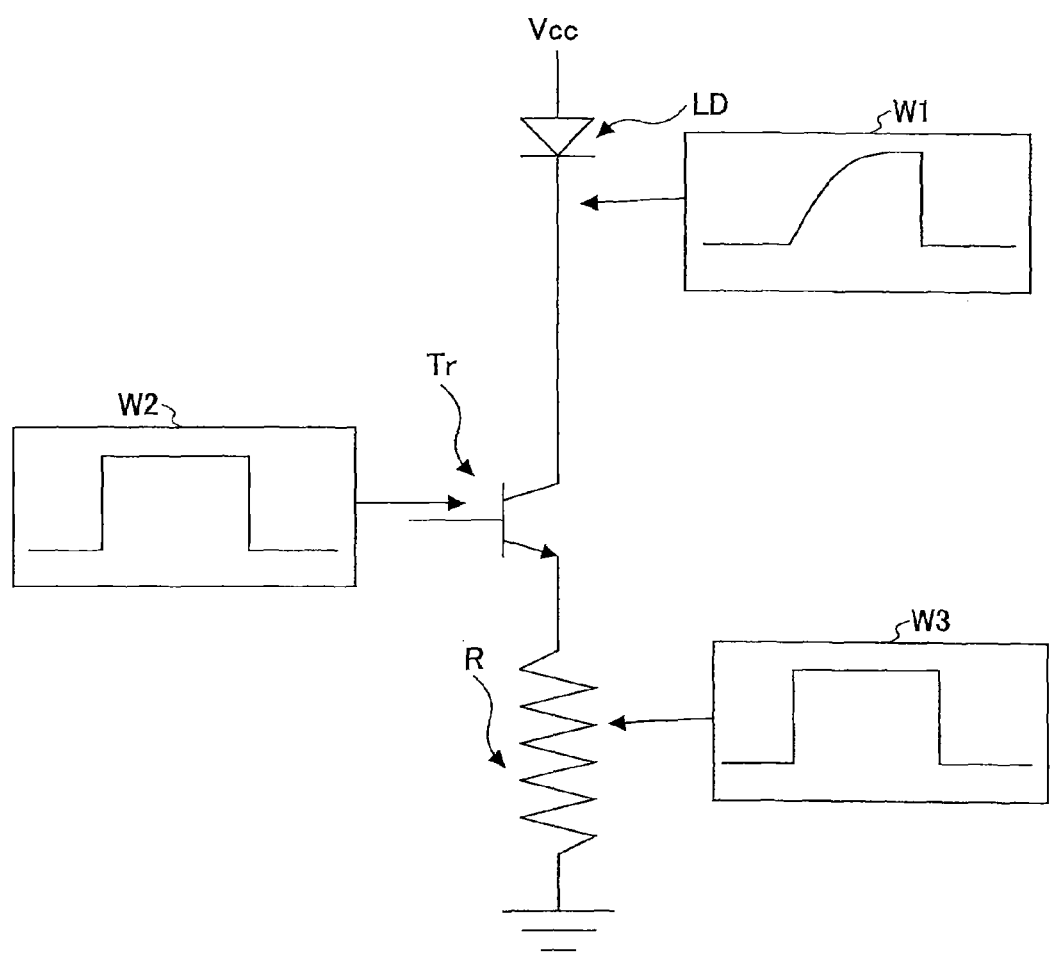
FIG. 27 is a circuit diagram illustrating one example of the related art semiconductor laser drive circuit.

FIG. 27 is a circuit diagram illustrating one example of a related art semiconductor laser drive circuit.

A related art semiconductor laser drive circuit includes a drive transistor Tr, into whose base (gate) a light emission signal is input. Moreover, the related art semiconductor laser drive circuit includes a semiconductor laser LD which is connected to a collector of a drive transistor Tr and a resistor R which is connected to an emitter of the drive transistor Tr.

In the related semiconductor laser drive circuit, when a light emission signal flows into a base of the drive transistor Tr, a semiconductor laser drive current flows into the semiconductor laser Ld and an emitter current flows into the resistor R. In FIG. 27, a waveform of the semiconductor laser drive current is W1; a waveform of the light emission signal is W2; and a waveform of the emitter current is W3.

Dullness in a rise current of the drive transistor Tr, a light emission delay, etc., occur in a path leading to the semiconductor laser LD from the drive transistor Tr, so that a waveform W1 of the semiconductor laser drive current turns into a waveform such as what is shown in (c) in FIG. 26.

Here, factors for the waveform W1 of the semiconductor laser drive current according to the related-art semiconductor laser drive circuit to turn into a waveform such as what is shown in (c) in FIG. 26 in a related-art semiconductor laser drive circuit possibly includes influences of an output impedance of a drive transistor Tr, a parasitic capacitance of wiring of a printed-circuit board, etc. Moreover, other factors possibly include influences of an input capacitance of the semiconductor laser LD, an impedance of the semiconductor laser LD, etc.

These influences may cause failures such as dullness in a rise of the drive transistor Tr, a light emission delay, etc., to occur in the waveform W1 of the semiconductor laser drive current according to the related art semiconductor laser drive circuit. When the above-described failures occur in the waveform W1 of the semiconductor laser drive current, a desired output (a light emission amount, a light emission time, etc.) by the semiconductor laser LD is not obtained in an initial period of light emission (for example, between T1 and T3 as shown in FIG. 26, for example).

On the other hand, the semiconductor laser drive circuit according to the present invention corrects for the semiconductor laser drive current by the below-described configuration.

Figure 28:
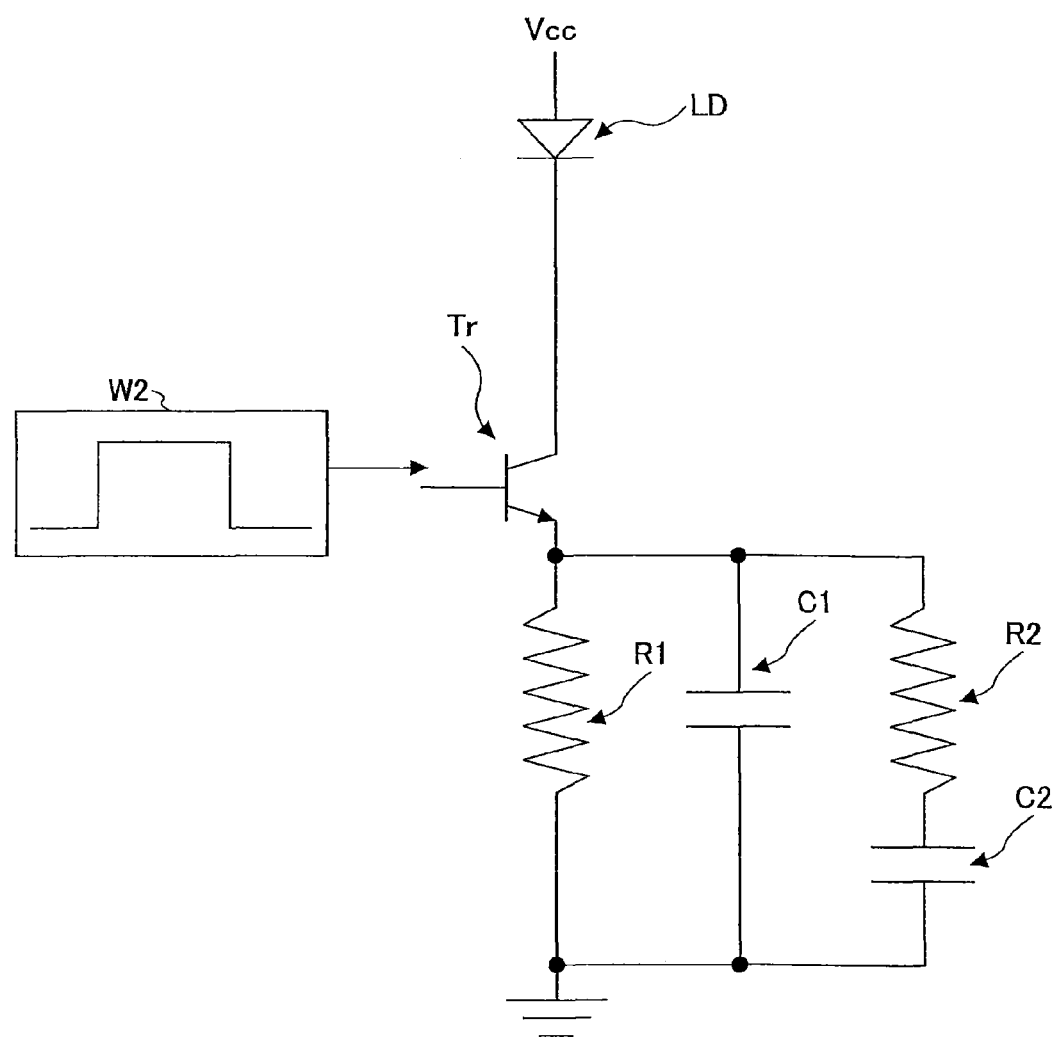
FIG. 28 is a circuit diagram illustrating an embodiment of the above-mentioned semiconductor laser drive circuit.

FIG. 28 is a circuit diagram which shows an embodiment of the semiconductor laser drive circuit according to the present circuit.

The semiconductor laser drive circuit includes a drive transistor Tr; and a semiconductor laser LD which is connected to a collector of the drive transistor Tr, which is the same as a related art semiconductor laser drive circuit shown in FIG. 27.

While a bipolar transistor is shown as one example in FIGS. 27 and 28 for the drive transistor Tr, it is not limited thereto in the present circuit. For example, as the drive transistor Tr, a CMOS (complementary metal oxide semiconductor) may also be used.

In the semiconductor laser drive circuit, a resistor R1 which corresponds to the light emission current generating unit 1 is connected to an emitter of the drive transistor Tr. Moreover, a capacitor C1 which corresponds to the first differential current generating unit 2 is connected to an emitter of the drive transistor Tr. Furthermore, a capacitor C2 and a resistor R2 corresponding to the second differential current generating unit 3 are serially connected to the emitter of the drive transistor Tr. In other words, in the semiconductor laser drive circuit, the capacitor C2 and the resistor R2; the capacitor C1; and the resistor R1 are connected in parallel to the emitter of the drive transistor Tr. The capacitor C2 and the resistor R2; the capacitor C1; and the resistor R1 may be connected to a source of the drive transistor Tr.

In the semiconductor laser drive circuit as described above, the first overshoot current is generated by the capacitor C1.

Here, a current which flows through the capacitor C1 becomes a simple differential waveform corresponding to the first overshoot current, so that a differential wave of only a change point of the modulation current is generated.

Moreover, in the semiconductor laser drive circuit as described above, the second overshoot current is generated by the capacitor C2 and the resistor R2. Here, a current which flows through the capacitor C2 becomes a simple differential waveform corresponding to the second overshoot current, so that a differential wave of only a change point of the modulation current is generated.

Next, a semiconductor laser drive current is described. A light emission signal is set by a signal input as an ON/OFF signal to an LD driver (not shown) from outside the semiconductor laser drive circuit.

The light emission signal is input into a base (a gate) of the drive transistor Tr shown in FIGS. 27 and 28 after being set to an appropriate level as a binary voltage signal by an LD driver.

A waveform W2 of the light emission signal is essentially identical to an ideal waveform shown in (b) in FIG. 26. Therefore, it is desirable that a height and a width of the pulse are identical to those of the waveform of the light emission signal even if some slight delay occurs.

Here, in the semiconductor laser drive circuit, it is assumed that a certain desired quantitative relationship applies between conversion from a voltage of the light emission signal shown in (a) in FIG. 26 to a modulation current shown in (d) in FIG. 26; and a drive current generated by the semiconductor laser drive circuit that is shown in (g) in FIG. 26 from the modulation current and that it is met.

Now, various failures such as a light emission delay, etc., occur in a path leading to the semiconductor laser LD from the drive transistor Tr as described previously even when the waveform of the modulation current is a square wave whose waveform is identical to the waveform of the light emission signal.

In order to improve such failures, in the first differential current generating unit 2, a first overshoot current for outputting in quite a short time (for example, less than or equal to 1 ns) is generated in which light emission does not actually occur even when the semiconductor laser LD shown in T1-T2 in (e) in FIG. 26 responds. In the first differential current generating unit 2, charging of the capacitor C1 occurs with a capacitance which corresponds to the influences which may cause the failures described previously to shorten a light emission delay time of the semiconductor laser LD.

Moreover, the second differential current generating unit 3 generates a second overshoot current for outputting in a time longer than a time for a first overshoot current that is shown in T1-T3 in (f) in FIG. 26, or more specifically, an initial light emission time (for example, less than or equal to 5 ns) in which the semiconductor laser LD responds.

As described above, the present circuit outputs the first overshoot current and the second overshoot current for times determined respectively such that dullness in a rise of the drive transistor Tr is corrected for. In this way, according to the present circuit, a waveform in times of T1-T3 is corrected for such as for a waveform of the semiconductor laser drive current shown in (g) in FIG. 26. In other words, the present circuit makes it possible to generate a waveform of a semiconductor laser drive current that is almost identical to a waveform of a light emission signal input from the LD driver.

While only the first overshoot current and the second overshoot current that are generated at a time of a rise of the modulation current are illustrated in (e) and (f) in FIG. 26, an undershoot current may be generated at a time of a fall of the modulation current. Generating the undershoot current at the time of the fall makes it possible for the semiconductor laser drive circuit to also perform an operation of turning OFF the semiconductor laser LD at high speed.

Moreover, as shown in (a), (e), and (f) in FIG. 26, it may be arranged to set, as the same time, a timing of supplying the second overshoot current, the first overshoot current waveform, and the light emission signal waveform. As a result, it is made possible for the semiconductor laser drive circuit to eliminate a light emission delay while obtaining a predetermined response waveform.

Moreover, it is made possible for the semiconductor laser drive circuit to change a relative magnitude relationship between a capacitance of the capacitor C1 and a resistance value of the resistor R1; and a capacitance of the capacitor C2 and a resistance value of the resistor R2 to change a current value of a current generated. In other words, when seeking to generate a corrected waveform shown in (g) in FIG. 26, it suffices to set R1=R2 and C1<C2, for example.

In other words, it is made possible for the present circuit to realize the corrected waveform shown in (g) in FIG. 26 in a simple configuration.

Moreover, the capacitance of the capacitor C1; the resistance value of the resistor R2; and the capacitance of the capacitor C2 may be made variable. In this way, in the semiconductor laser drive circuit, a semiconductor laser drive current may be corrected for regardless of a light amount (output) or a type of the semiconductor laser LD.

Here, configurations which make the resistance value and the capacitance variable include a configuration such that a number of combinations of a capacitance and a resistance value of the capacitor C2; the resistor R2; and the capacitor C1 is determined and a selection thereof is set to a register to obtain a desired characteristic.

Next, a reason is explained for generating two types of overshoot currents of a first overshoot current and a second overshoot current in order to correct for a current at a time of a rise of the semiconductor laser LD.

Figure 29:
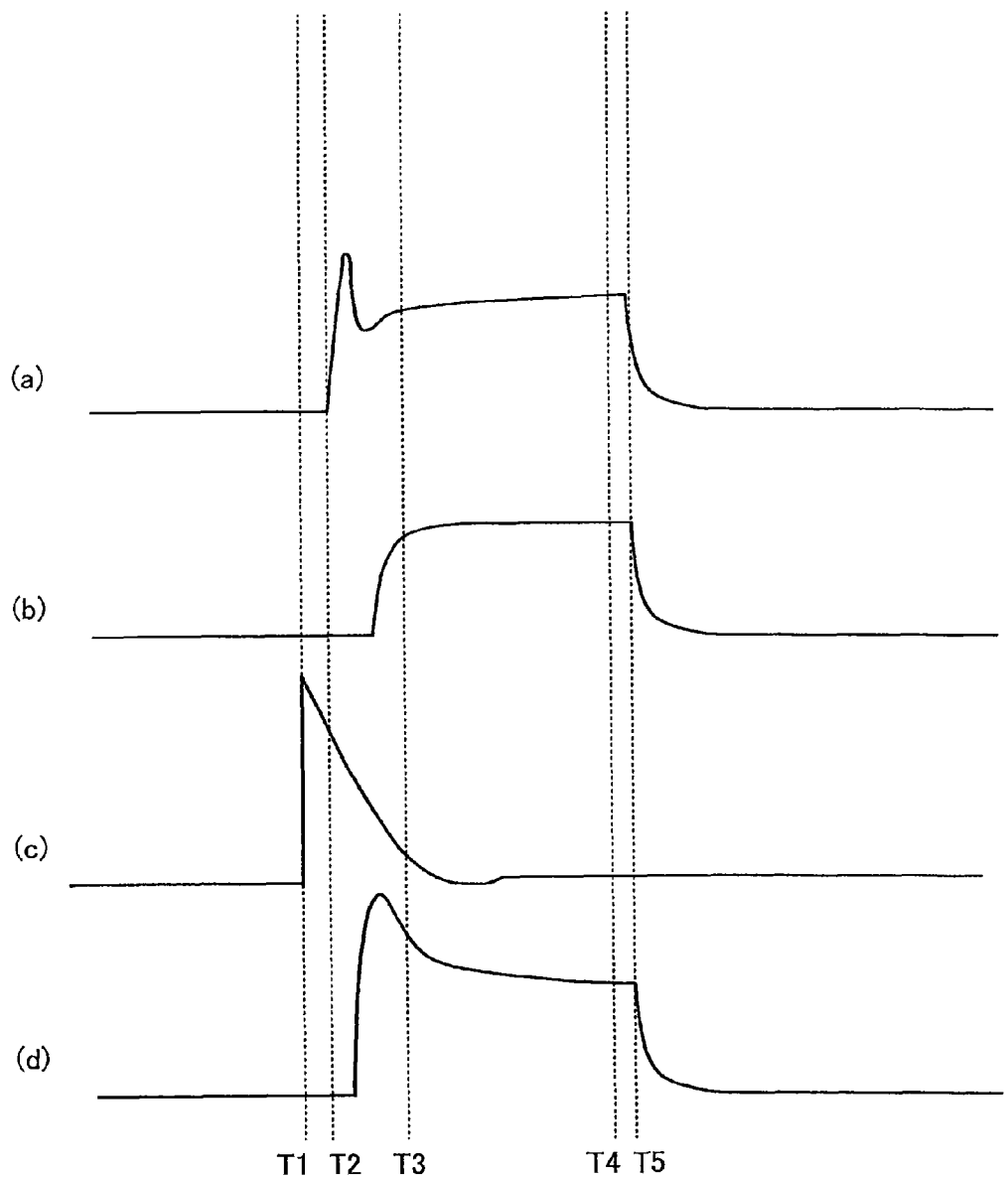
FIG. 29 is a waveform diagram illustrating a relationship between a waveform of a semiconductor laser drive current generated by the above-mentioned semiconductor laser drive circuit and an overshoot current.

FIG. 29 shows a set of waveform diagrams illustrating a relationship between an overshoot current and a waveform of a semiconductor laser drive current generated by the present circuit.

(a) in FIG. 29 is a waveform diagram of a semiconductor laser drive current which is corrected for only by the first overshoot current.

(b) in FIG. 29 is a waveform diagram of the semiconductor laser drive current which is corrected for only by the second overshoot current.

(c) in FIG. 29 is a waveform diagram of the semiconductor laser drive current which is corrected for by increasing the current value of the second overshoot current.

(d) in FIG. 29 is a waveform diagram of the semiconductor laser drive current which is corrected for by the second overshoot current in (c) in FIG. 29.

As shown in (a) in FIG. 29, when the semiconductor laser drive current is corrected for only by the first overshoot current, a light emission delay amount at a time of a rise is corrected for. However, overshooting or undershooting (ringing) occurs in the subsequent waveform. Therefore, with the correction only by the first overshoot current, it is not possible for the semiconductor laser LD to obtain a favorable and stable integrated light amount.

On the other hand, when the semiconductor laser drive current is corrected for only by the second overshoot current, there is a certain correction effect for the light emission delay amount as shown in (b) in FIG. 29. However, in order to correct for the light emission delay amount at an initial stage of a rise in this case, it is possible to increase a current value of the second overshoot current as shown in (c). However, increasing the current value of the second overshoot current could cause the optical waveform to overshoot as shown in (d) in FIG. 29.

As described above, in order to stably generate a desired optical waveform regardless of a characteristic such as a type of the semiconductor laser LD, it is effective to conduct correction by two types of overshoot currents as in the semiconductor laser drive circuit.

Next, a relationship between an output and a drop voltage and a semiconductor laser drive current in the semiconductor laser drive circuit is described.

Figures 30, 31:
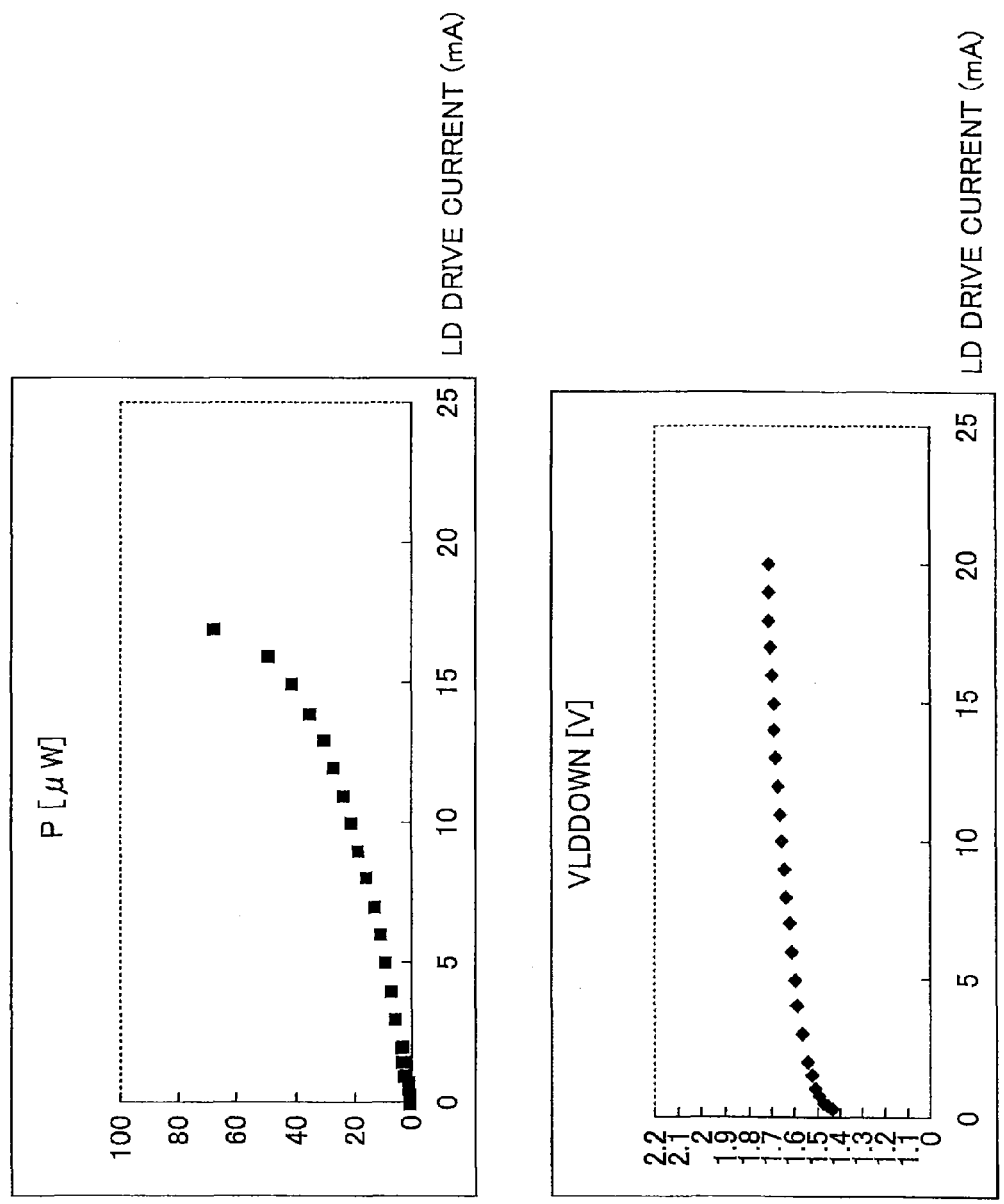
FIG. 30 is a diagram illustrating a change in output when a weak current is applied to a semiconductor laser.
FIG. 31 is a diagram illustrating a change in a drop voltage when the weak current is applied to the semiconductor laser.

FIG. 30 is a diagram illustrating a change in output when a weak current is applied to the semiconductor laser LD. Moreover, FIG. 31 is a diagram illustrating a change in a drop voltage when the weak current is applied to the semiconductor laser LD. Furthermore, FIG. 32 is a table illustrating an output and a drop voltage when the weak current is applied to the semiconductor laser LD.

As shown in FIGS. 30 to 32, in the semiconductor laser drive circuit, a drive current LD of the semiconductor laser LD and a drop voltage VLDDOWN of the semiconductor laser LD rise, and an output also rises.

More specifically, as shown in FIG. 31, when the drive current LD of the semiconductor laser LD is 250 µA, there is already the drop voltage VLDDOWN of around 1.4V in the semiconductor laser LD. As the semiconductor laser LD includes a direct current resistance component, when LD increases, the VLDDOWN also gradually increases.

Here, the reason that there is some VLDDOWN even for a slight current value of LD is possibly that LD causes an impedance of the semiconductor laser LD to decrease, so that a response characteristic of the semiconductor laser LD when a threshold current is applied improves.

In other words, using the first overshoot current, electricity is supplied to the capacitor C1 in a range such that light emission does not occur due to the semiconductor laser LD responding and for a very short time (for example, less than or equal to 1 ns), so that a parasitic capacitance of the semiconductor laser drive circuit such as a semiconductor laser LD, an LD driver, etc., becomes around 1.4V.

In this way, the semiconductor laser drive circuit causes the semiconductor laser LD to be operable quickly by the first overshoot current and the second overshoot current. Therefore, it is made possible for the semiconductor laser drive circuit to cause the semiconductor laser LD to be able to be speedily turned on instantaneously.

While an example using a predetermined semiconductor laser LD is described in FIGS. 30 to 32, a similar characteristic is also demonstrated in a different semiconductor laser LD. In other words, the semiconductor laser drive circuit may eliminate a light emission delay while obtaining a predetermined response waveform for driving the semiconductor laser for various types of semiconductor lasers. (Principles of light emission delay of semiconductor laser LD)

Next, principles of waveform dullness and a light emission delay of the semiconductor laser LD are described.

Figure 33:
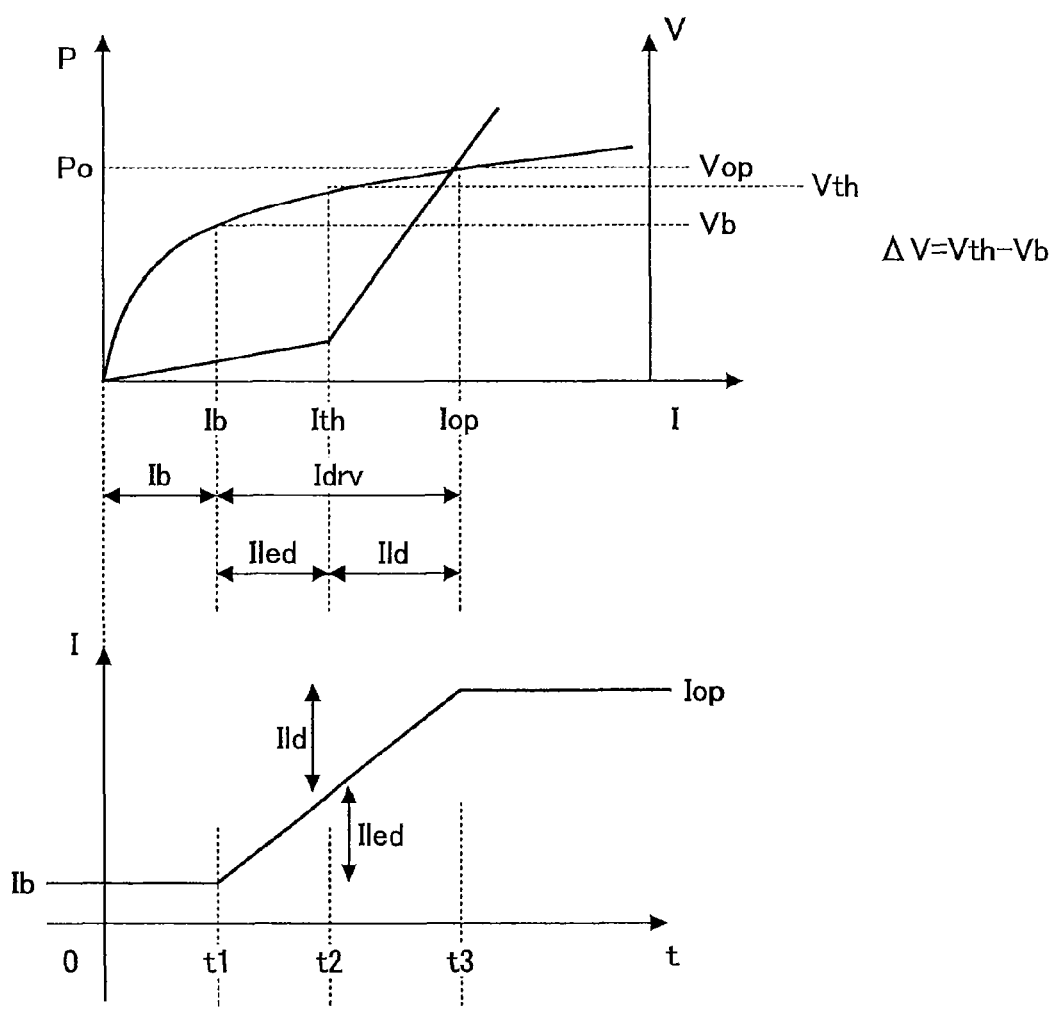
FIG. 33 is a diagram illustrating a drive current waveform and an IL characteristic of the semiconductor laser.

FIG. 33 is a diagram illustrating a drive current waveform and an IL characteristic (injection current-Light output characteristic) of the semiconductor laser. In FIG. 33, symbols for the respective currents represent the following:

Iop: laser operation current
Ith: laser threshold current
Ib: bias current
Idrv: Iop−Ib=Ild+Iled: laser drive current for driving at high speed Ild: current corresponding to LD region of laser
Iled: current corresponding to LED region of laser
Vop: operating voltage at time of light emission
Vth: voltage at time of applying threshold current
Vb: voltage at time of applying bias current
ΔV: Vth-Vb: differential voltage when changing from operating voltage at time of applying bias current to operating voltage at time of light emission.

When driving the semiconductor laser in a LBP (Laser-Beam Printer), it is desired to apply a bias current up to Ith, considering an operation of the semiconductor laser.

However, such a case may cause an LED light emission in the semiconductor laser, possibly causing surface staining of a photosensitive body. Thus, when driving the semiconductor laser, a current value is normally set to less than or equal to Ith.

Moreover, as for Ib, assuming Ib=0, a rise characteristic of light deteriorates. Therefore, a certain amount of Ib normally needs to be applied. In other words, Ib is set in a tradeoff of reducing current consumption and a rise characteristic of light of the semiconductor laser LD.

In a drive current waveform for lighting the semiconductor laser LD shown in FIG. 33, it is assumed that a rise of a current operates in a straight-line approximation for brevity of explanations.

It is assumed that the drive current rises from Ib at time t1; becomes Ib+Iled at time t2; and becomes Iop=Ib+Iled+Ild at time t3.

Figure 34:
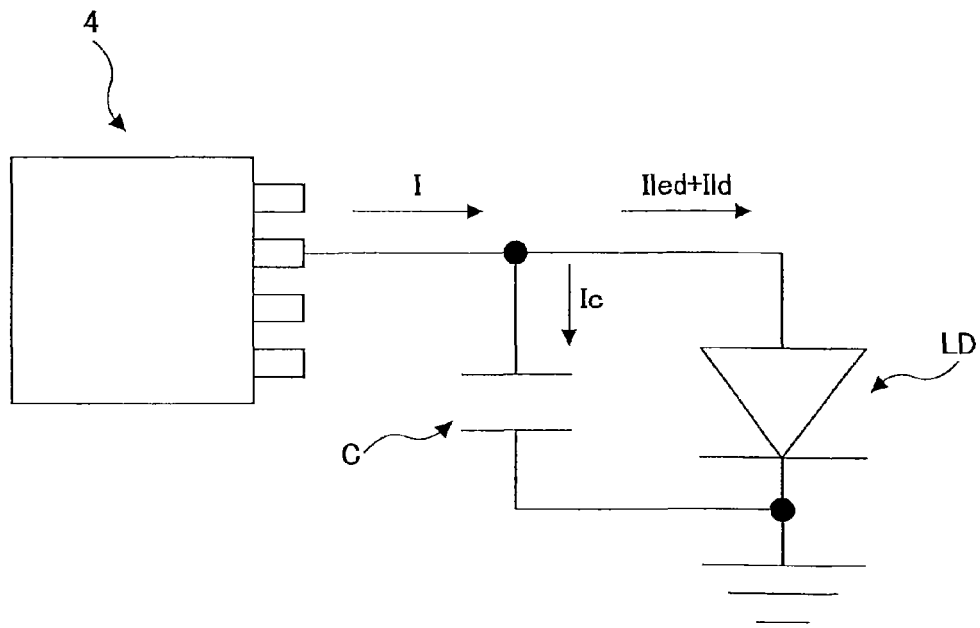
FIG. 34 is a conceptual diagram illustrating a relationship between a current flowing within a circuit and a driver supplying a drive current to the semiconductor laser.

FIG. 34 is a conceptual diagram illustrating a relationship between a current flowing within a circuit and a driver which supplies a drive current to the semiconductor laser.

In a semiconductor laser drive circuit in which a semiconductor laser LD and an LD driver 4 are mounted, when connecting between the semiconductor laser LD and the LD driver 4 by wiring, there are multiple parasitic capacitances such as a parasitic capacitance of a semiconductor laser package, etc.; a parasitic capacitance of a LD driver 4 package, etc.; a parasitic capacitance due to wiring, etc. Here, in FIG. 34, multiple parasitic capacitances are denoted as C.

In other words, in the semiconductor laser LD, after Ic, which is a current for charging a parasitic capacitance C, flows, Iled+Ild, which is a current to be inherently applied to the semiconductor laser LD flows. Then, there occurs a time difference before Iled+Ild flows after Ic flows into the semiconductor laser LD.

Here, it is assumed that a total of parasitic capacitances in the semiconductor laser drive circuit be C. As shown in FIG. 34, in a transient operation from t0 to t1, out of a current I which is output from the semiconductor laser drive circuit, a transient current Ic flows into the parasitic capacitance C. Thereafter, current (Iled+Ild) flows in the semiconductor laser LD.

Figure 35:
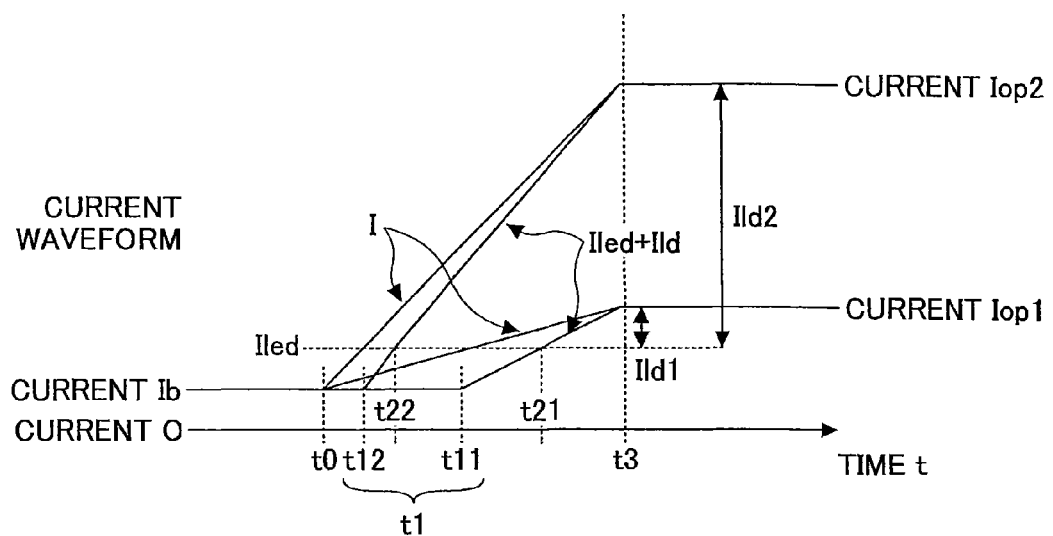
FIG. 35 is a diagram which illustrates a drive current waveform of the semiconductor laser when an optical output is different from the drive current waveform in FIG. 33.

FIG. 35 is a diagram which illustrates a drive current waveform of the semiconductor laser when an optical output is different from the drive current waveform in FIG. 33.

It is assumed that, in the semiconductor laser drive circuit, a rise occurs in the same time t3-t1 regardless of a drive current amount.

For brevity of explanations, FIG. 35 shows a hypothetical current waveform diagram in which it is assumed that a time from time t0 to t1 be Ic, after which (Iled+Ild) flows, and Ic becomes 0 at time t3.

Moreover, in FIG. 35, a case of a current Iop2 and a case of a current Iop1 with a current value smaller than Top is described, assuming that desired currents differ.

More specifically, in the case of Iop2, (Iled+Ild) becomes Ib at time t0; Ib at time t12 (with Ic flowing between t0 and t11); Iled at time t22; and Iop2 at time t3.

On the other hand, in the case of Iop1, it becomes Ib at time t0; Ib at time t11 (with Ic flowing between t0 and t11); Iled at time t21; and Iop1 at time t3.

Moreover, a pulse light emission delay time (a time in which pulse narrowing of optical pulse and drive current pulse occurs) is considered to be able to be calculated by a sum of a time to reach Iled; and a difference of a charge time for a parasitic capacitance C.

In other words, when the current is Iop1, the pulse light emission delay time is $$(t11-t0)+(t21-t11)=(t21-t0).$$

On the other hand, when the current is Iop2, the pulse light emission delay time is $$(t12-t0)+(t22-t12)=(t22-t0).$$

Next, the parasitic capacitance C of the semiconductor laser drive circuit is described. As described previously, the parasitic capacitance C of the semiconductor laser drive circuit is a certain value determined by an output capacitance of a driver, a board, and an input capacitance of an LD element. Thus, a required charge Q is Q=C×ΔV.

In other words, a charge Q1 in the case of the current Iop1 and a charge Q2 in the case of Iop2 are respectively $$Q1=1/2 \times Iop1 \times \{(t11-t0)/(t3-t0)\} \times (t11-t0); \text{ and}$$

$$Q2=1/2 \times Iop2 \times \{(t12-t0)/(t3-t0)\} \times (t12-t0).$$

Then, assuming a current ratio Iop1/Iop2=K, $$(t12-t0)/(t11-t0)$$

becomes a square root of K.

Therefore, as for the charge time for the parasitic capacitance C, determining a ratio K of Iop1 and Iop2 leads to determining a ratio of the delay time. Thus, a difference in the charge time for the parasitic capacitance C due to a difference in the drive current may be corrected for by expanding a pulse such that the above-mentioned delay time is subjected to reverse correction.

Here, when Iled is sufficiently small, 4V is also sufficiently small, so that correcting for pulse narrowing due to the drive current difference may not be needed. In such a case, when Iled/(Iled+Ild)<0.1, or, in other words, when the parasitic capacitance C is sufficiently charged, there is no need for the correcting. On the other hand, when Iled/(Iled+Ild)≥0.1, charging into the parasitic capacitance C cannot be ignored, so that the correcting becomes necessary.

Next, a difference is considered for Iop1 and Iop2 of a time for a current which flows into the semiconductor laser LD to reach Iled.

The time to reach Iled results in a current ratio of Iop. Thus, the difference of the time for the current which flows into the semiconductor laser LD to reach Iled becomes Iop1/Iop2= (t21-t11)/(t22-t12)=K.

Figure 36:
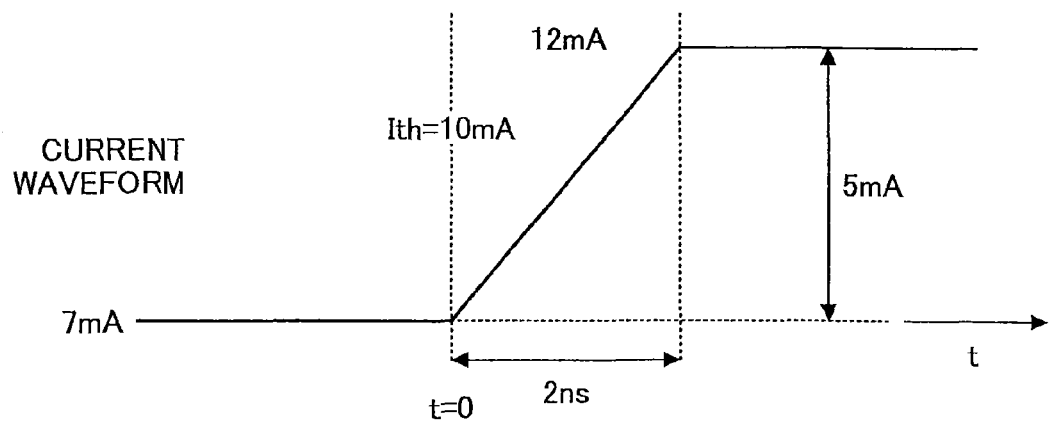
FIG. 36 is a diagram illustrating the drive current waveform of the semiconductor laser in the present semiconductor laser drive circuit.

FIG. 36 is a diagram illustrating the drive current waveform of the semiconductor laser in the semiconductor laser drive circuit. A pulse narrowing time which occurs in the semiconductor laser drive circuit is described using FIG. 36.

It is assumed that a rise time of the drive current applied to the semiconductor laser is 2 ns; Ith=10 mA; Ib=7 mA; and a difference ΔV (in the LD operating voltage at Ith-Ib)=0.25V.

Here, a behavior is considered of the semiconductor laser LD when Iled=Ith-Ib=3 mA; Ild=2 mA; and a total current It1=5 mA are applied.

First, an amount of correction due to charging a parasitic capacitance is considered. Assuming the parasitic capacitance between the semiconductor laser and the LD driver 4 of 5 pF, $Q=5\times10^{-12}\times0.25\times10^{-12}$ from Q=C×V.

Moreover, an applied current amount Itr at a rise portion is shown by the following equation as a function of time t.

$$Itr = 2.5 \times 10^{-3} \times 10^9 \times t$$

Here, $$Q = 1/2 \times Itr \times t = 1/2 \times 2.5 \times 10^{-3} \times 10^9 \times t^2$$

Moreover, Q=CV yields $$Q = 1.25 \times 10^{-12} = 1/2 \times 2.5 \times 10^{-3} \times 10^9 \times t^2$$

With $t=1 \times 10^{-9}$, a delay of 1 ns in a rise occurs for the semiconductor laser LD.

Here, assuming Ild=20 mA, with a total current It2=23 mA yielding $t=0.466 \times 10^{-9}$, a delay of 0.466 ns in a rise occurs for the semiconductor laser LD. A delay time tled1 due to Iled is a time corresponding to a square root of a total current ratio of It1/It2.

Next, correction of a delay time of Iled is considered. It1=5 mA yields It1=Iled (3 mA)+Ild (2 mA).

When a rise time of the drive current is 2 ns and the delay time due to Iled is tled1, a delay of tled1=2 ns×(3 mA/5 mA)=1.2 ns occurs. Here, It1=23 mA yields It1=Iled (3 mA)+Ild (20 mA).

When a rise time of the drive current is 2 ns, a delay time tled2 due to Iled becomes tled2=2 ns×(3 mA/23 mA)=0.26 ns. In other words, the delay time tled2 due to Iled is a time corresponding to a total current ratio of It1/It2.

As described above, when a total current it1=5 mA is applied, a total 2.2 ns of a delay of ins that is an amount of correction due to charging the parasitic capacitance C; and 1.2 ns that is a correction amount of a delay time of Iled becomes a delay time, or, in other words, a pulse narrowing time in the whole semiconductor laser drive circuit.

Figure 37:
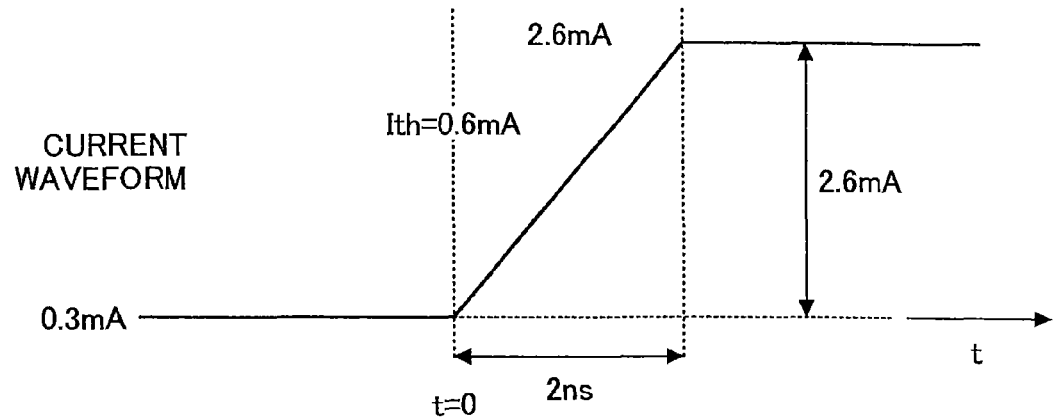
FIG. 37 is a diagram illustrating a drive current waveform of a VCSEL in the present semiconductor laser drive circuit.

FIG. 37 is a diagram illustrating a drive current waveform of a VCSEL in the present circuit. The pulse narrowing time in a surface emitting laser (VCSEL) is described using FIG. 37.

It is assumed that a rise time of the drive current applied to the VCSEL is 2 ns; Ith=0.6 mA; Ib=0.3 mA; and a difference $\Delta V$ (in LD operating voltage at Ith-Ib)=0.34V.

Here, a behavior is considered when Iled=Ith-Ib=0.3 mA; Ild=0.2 mA; and It3=0.5 mA are applied.

First, an amount of correction due to charging a parasitic capacitance is considered. Here, assuming the parasitic capacitance between the semiconductor laser and the LD driver 4 of 5 pF, $Q = 5 \times 10^{-12} \times 0.34 = 1.7 \times 10^{-12}$ from $Q = C \times V$.

Moreover, an applied current amount Itr at a rise portion is shown by the following equation as a function of time t:

$$Itr = 2.5 \times 10^{-3} \times 10^9 \times t$$

Here, $$Q = 1/2 \times Itr \times t = 1/2 \times 2.5 \times 10^{-3} \times 10^9 \times t^2$$

From Q=CV, $$Q = 1.7 \times 10^{-12} = 1/2 \times 2.5 \times 10^{-3} \times 10^9 \times t^2$$

$t=3.69 \times 10^{-9}$, causing a delay in a rise of 3.69 ns.

Here, Ild=2 mA and a total current It4=2.3 mA yields $t=0.466 \times 10^{-9}$, causing a delay of 0.466 ns in a rise. This is a time corresponding to a square root of a total current Ith ratio It1/It2.

Next, correction of a delay time of Iled is considered. It4=0.5 mA yields It4=Iled (0.3 mA)+Ild (0.2 mA).

Here, a delay time tled3 due to Iled and a rise time 2 ns of the drive current causes a delay of $$tled3 = 2 \text{ ns} \times (0.3 \text{ mA}/0.5 \text{ mA}) = 1.2 \text{ ns}.$$

It1=2.3 mA yields It4=Iled (0.3 mA)+Ild (0.2 mA).

A delay time tled4 due to Iled and a rise time 2 ns of the drive current causes a delay of tled4=2 ns×(0.3 mA/2.3 mA). This is a time corresponding to a total current Ith ratio of It1/It2.

As described above, when a total current It3=0.5 mA is applied, a total 4.88 ns of a delay of 3.68 ns that is an amount of correction due to charging the parasitic capacitance C; and 1.2 ns that is a correction amount of a delay time of Iled becomes a delay time, or, in other words, a pulse narrowing time in the whole semiconductor laser drive circuit.

In a case of the VCSEL, a drive current is smaller than that of the semiconductor laser, causing a larger delay and requiring more correction for pulse delay narrowing.

Moreover, even for the semiconductor laser, when Ith or the drive current is small, the above-described correction becomes effective when used in a low light amount.

(Operational advantages related to the embodiment of the semiconductor laser drive circuit)

According to the above-described embodiment of the semiconductor laser drive circuit, the first differential current generating unit 3 and the second differential current generating unit 3 generate two types of overshoots to thereby reduce a light emission delay time which is a lighting time difference between laser light emission and a drive current of a semiconductor laser due to a parasitic capacitance which is parasitic on a portion from a driver to a semiconductor laser.

In other words, according to the above-described embodiment of the semiconductor laser drive circuit, a semiconductor laser drive circuit having a superior pulse width reproducibility may be realized without narrowing a pulse width of a light emission signal.

Moreover, according to the above-described embodiment of the semiconductor laser drive circuit, a high-speed and high-accuracy semiconductor laser drive circuit may be provided with a superior tone reproduction in low density without depending on a characteristic of the semiconductor laser.

Furthermore, according to the above-described embodiment of the semiconductor laser drive circuit, timings for supplying the first overshoot current and the second overshoot current and a timing for supplying the semiconductor laser drive current may be set to be the same time to eliminate a light emission delay while obtaining a predetermined response waveform.

Moreover, according to the above-described embodiment of the semiconductor laser drive circuit, the first overshoot current and the second overshoot current are generated by a signal which differentiates a delay signal of a semiconductor laser drive current or the semiconductor laser drive current, making it possible to eliminate a light emission delay while obtaining a predetermined response waveform.

Furthermore, according to the above-described embodiment of the semiconductor laser drive circuit, the first differential current generating unit 2 may be configured with the capacitor C1 and the second differential current generating unit 3 may be configured with the resistor R2 and the capacitor C2 to eliminate a light emission delay while obtaining a predetermined response waveform with a simple configuration.

Moreover, according to the above-described embodiment of the semiconductor laser drive circuit, a high-speed and high-accuracy semiconductor laser drive circuit may be provided with a superior tone reproduction in low density without depending on a characteristic of the semiconductor laser using a variable resistor and a variable capacitor.

Furthermore, according to the above-described embodiment of the semiconductor laser drive circuit, a superior high-speed and high-accuracy semiconductor laser drive circuit may be provided without depending on a characteristic of the semiconductor laser as a VCSEL, a red laser, a red laser array, etc., may be used as a semiconductor laser. (Image forming apparatus including the semiconductor laser drive circuit)

Next, an image forming apparatus including the semiconductor laser drive circuit is described.

Figure 38:
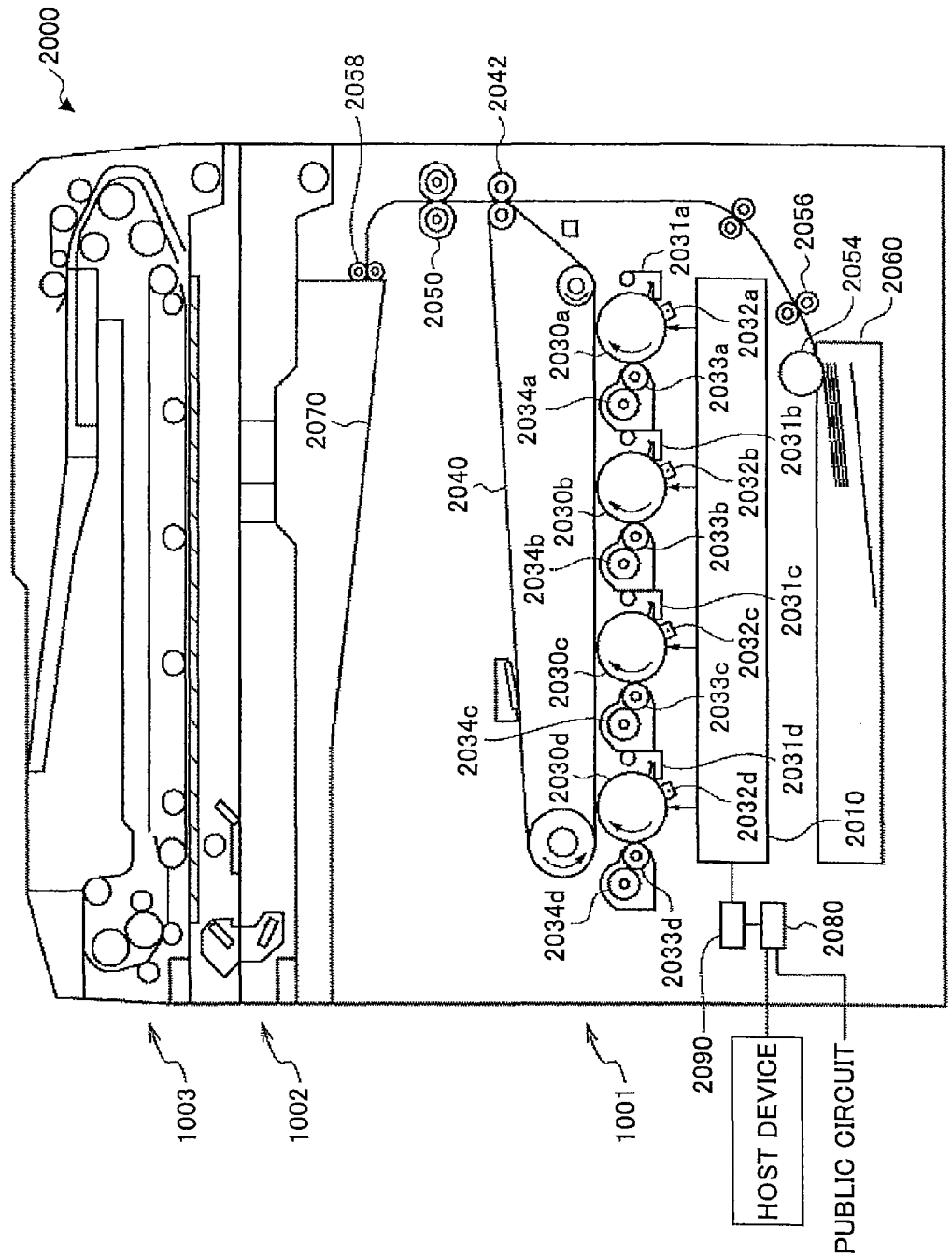
FIG. 38 is a central sectional diagram illustrating an embodiment of the image forming apparatus which includes the present semiconductor laser drive circuit.

FIG. 38 is a central sectional diagram illustrating an embodiment of the image forming apparatus including the semiconductor laser drive circuit. An image forming apparatus 2000, which is a multi-functional machine including respective functions of a copier, a printer, and a facsimile machine, includes a main body apparatus 1001; a reading apparatus 1002; an automatic document feeding apparatus 1003, etc.

The main body apparatus 1001, which is a tandem multi-color printer which forms a full-color image by overlaying four colors (black, cyan, magenta, yellow), includes an optical scanning apparatus 2010; photosensitive drums 2030 (2030a, 2030b, 2030c, 2030d); a transfer belt 2040; a transfer roller 2042; a fixing roller 2050; a paper-feeding roller 2054; a regist roller pair 2056; a paper-discharging roller 2058; a paper-feeding tray 2060; a paper-discharging tray 2070; a communication control apparatus 2080; and a printer control apparatus 2090.

The communication control apparatus 2080 controls two-way communications with a host apparatus such as a personal computer, etc., via a communications network, etc. The printer control apparatus 2090 integrally controls respective units included in the image forming apparatus 2000.

Below a paper face of the transfer belt 2040 are arranged, in an order of one for yellow 2032d; one for magenta 2030c; one for cyan 2030b; and one for black 2030a from the upstream side in a moving direction of the transfer belt 2040 (counter-clockwise on a paper face in FIG. 38), photoconductive photosensitive drums 2030 formed in a cylindrical shape as image bearing bodies which are exposed by the optical scanning apparatus 2010 and on which electrostatic latent images are formed.

Surrounding the respective photosensitive bodies 2030 are arranged, in order in a rotating direction of the photosensitive drum, process members which follow an electrophotographic technique (an electrophotographic process), charging apparatuses 2032 (2032a, 2032b, 2032c, 2032d); developing rollers 2033 (2033a, 2033b, 2033c, 2033d); toner cartridges 2034 (2034a, 2034b, 2034c, 2034d); cleaning units 2031 (2031a, 2031b, 2031c, 2031d), etc.

As a charging unit, a corona changer may also be used.

The photosensitive drum 2030a; the charging apparatus 2032a; the developing roller 2033a; the toner cartridge 2034a; and the cleaning unit 2031a are used as a set, configuring an image forming station which forms a black (K) image.

The photosensitive drum 2030b; the charging apparatus 2032b; the developing roller 2033b; the toner cartridge 2034b; and the cleaning unit 2031b are used as a set, configuring an image forming station which forms a cyan (C) image.

The photosensitive drum 2030c; the charging apparatus 2032c; the developing roller 2033c; the toner cartridge 2034c; and the cleaning unit 2031c are used as a set, configuring an image forming station which forms a magenta (M) image.

The photosensitive drum 2030d; the charging apparatus 2032d; the developing roller 2033d; the toner cartridge 2034d; and the cleaning unit 2031d are used as a set, configuring an image forming station which forms a yellow (Y) image.

The optical scanning apparatus 2010 which corresponds to a scanning unit according to the present invention is an optical writing apparatus which optically writes onto the photosensitive drum 2030 and executes an exposing process of the electrophotographic process. The optical scanning apparatus 2010 irradiates, onto a surface of a charged photosensitive drum 2030, light beams modulated to respective colors (image modulation signals) based on multi-color image information (black image information, cyan image information, magenta image information, yellow image information) from a host apparatus connected to the communications control apparatus 2080. On the surface of the photosensitive drum (rotating photosensitive body) 2030, electric charges disappear only on a portion onto which the light beams are irradiated, so that an electrostatic latent image corresponding to the image information is formed. The formed electrostatic latent image, which is a negative latent image, moves in a direction of a corresponding developing roller 2033 with a rotation of the photosensitive drum 2030.

Here, into the optical scanning apparatus 2010 is embedded the above-described semiconductor laser drive circuit. Then, a semiconductor laser of the optical scanning apparatus 2010 is driven by the semiconductor laser drive circuit to irradiate the light beams onto the photosensitive drum 2030.

In the toner cartridge 2034a is stored black toner; in the toner cartridge 2034b is stored cyan toner; in the toner cartridge 2034c is stored magenta toner; and in the toner cartridge 2034d is stored yellow toner. Toners of respective colors that are stored in the toner cartridges 2034 are supplied to the corresponding developing roller 2033.

With a rotation of the developing roller 2033, toner from the corresponding toner cartridge 2034 is thinly and uniformly applied onto a surface of the developing roller 2033. When in contact with a surface of the photosensitive drum 2030 corresponding to respective colors, as the toner applied to the surface of the developing roller 2033 adheres to the electrostatic latent image formed on a surface of the photosensitive drum 2030, the electrostatic latent image is visualized, so that the toner image is formed. The formed toner image moves in a direction of the transfer belt 2040 with a rotation of the photosensitive drum 2030.

Toner images of each color of yellow, magenta, cyan, and black are successively transferred onto the transfer belt 2040 at predetermined timings, so that a color image is formed.

A transfer paper sheet which is a recording medium is stored in a paper-feeding tray 2060. Near the paper-feeding tray 2060, a paper-feeding roller 2054 is arranged. The uppermost transfer paper sheet stored in the paper-feeding tray 2060 is fed to the paper-feeding roller 2054 and a tip of the fed transfer paper sheet is caught by the regist roller pair 2056. The regist roller pair 2056 sends out, toward a gap between the transfer belt 2040 and the transfer roller 2042, the transfer paper sheet in alignment with a timing at which a toner image on the photosensitive drum 2030 moves to a transfer position. Onto the sent out transfer paper sheet is transferred a color image on the transfer belt 2040. The transfer paper sheet onto which the color image is transferred is sent out to the fixing roller 2050.

To the transfer paper sheet sent out to the fixing roller 2050 is applied heat and pressure, so that toner is fixed onto the transfer paper sheet. The transfer paper sheet onto which the toner is fixed is sent out to the paper-discharging tray 2070 via the paper-discharging roller 2058, so that it is successively stacked onto the paper-discharging tray 2070.

The cleaning unit 2031 removes toner (residual toner) which remained on a surface of the photosensitive drum 2030 after the toner image is transferred. A surface of the photosensitive drum 2030 from which the residual toner is removed returns again to a position opposing the corresponding charging apparatus 2032.

(Operational Advantages Related to the Embodiment of the Semiconductor Laser Drive Circuit)

According to the above-described embodiment of the semiconductor laser drive circuit, the semiconductor laser drive circuit may be used to eliminate a light emission delay while obtaining a predetermined response waveform with a simple configuration.

While the present invention has been described in the above based on the respective embodiments, the present invention is not to be limited to requirements shown in the above-described embodiments. These points may be changed within a range which does not impair the gist of the invention and may be appropriately determined in accordance with applications thereof.

The present application is based on and claims the benefit of Japanese Priority Application No. 2012-255470 filed on Nov. 21, 2012 and on Japanese Priority Application No. 2012-260529 filed on Nov. 29, 2012, the entire contents of which are hereby incorporated by reference.

The invention claimed is:

1. A light source drive circuit which drives a light source, comprising:
    a drive current generating unit which generates a drive current, the driving current including a predetermined current for obtaining a predetermined light amount from the light source; and first and second overshoot currents which are applied to the predetermined current in synchronization thereto; and
    a control unit which sets, to the drive current generating unit, a value of the first overshoot current to a fixed value, and a value of the second overshoot current to a value that is variable in accordance with a light amount output from the light source.

2. The light source drive circuit as claimed in claim 1, further comprising:
    a signal generating unit which generates a first signal and a second signal, the first signal causing the first overshoot current to be applied to the predetermined current for a first overshoot period and the second signal causing the second overshoot current to be applied to the predetermined current for a second overshoot period, wherein
    the first overshoot period is a period which is shorter than a period from a rise of the predetermined current to when light emission of the light source is detected.

3. The light source drive circuit as claimed in claim 2, further comprising:
    a light receiving element which receives a light emitted from the light source and outputs a signal of a magnitude corresponding to an amount of the light received;
    an integrating unit which integrates a signal waveform output from the light receiving element;
    a current value setting unit which sets a value of the second overshoot current; and
    a lighting pattern storage unit which stores therein a lighting pattern signal for lighting the light source for a predetermined period and turning off the light source for a predetermined period, wherein
    the current value setting unit includes
        a current value selecting unit which selects a current value to be added to the predetermined current in an ascending order thereof; and
        a determining unit which determines whether an integrated value of the signal waveform of the light receiving element when a current in which the current value is added to the predetermined current is supplied to the light source is within a predetermined range which is set in advance, wherein
        the current value is set to the second overshoot current when the integrated value falls within the predetermined range.

4. The light source drive circuit as claimed in claim 2, wherein the first overshoot period is a period from when supplying, to the light source, of a current is started, the current being less than or equal to a current corresponding to a maximum value of an optical output in a current-optical output characteristic of the light source and being larger than the predetermined current to when the light source emits light.

5. The light source drive circuit as claimed in claim 2, wherein the drive current includes an undershoot current which is subtracted from the predetermined current in synchronization with a fall of the predetermined current, and wherein a current amount of the undershoot current is equal to a sum of a current amount of the first overshoot current and a current amount of the second overshoot current.

6. The light source drive circuit as claimed in claim 5, wherein an undershoot period in which the undershoot current is subtracted from the predetermined current is equal to the second overshoot period.

7. The light source drive circuit as claimed in claim 1, wherein the predetermined current includes a bias current set in advance and a switching current which is supplied to the light source based on a lighting control signal of the light source.

8. An optical scanning apparatus, comprising:
    a light source;
    a reflecting mirror which causes a light irradiated from the light source to be reflected; and
    a light source drive circuit as claimed in claim 1.

9. An image forming apparatus comprising:
    a light source;
    a reflecting mirror which causes a light irradiated from the light source to be reflected;
    a photosensitive body which is scanned by a reflected light which is reflected by the reflecting mirror; and
    the light source drive circuit as claimed in claim 1.

* * * * *